(12) United States Patent
Hatsumi et al.

(10) Patent No.: US 12,242,147 B2
(45) Date of Patent: Mar. 4, 2025

(54) SEMICONDUCTOR DEVICE AND DISPLAY DEVICE

(71) Applicant: SEMICONDUCTOR ENERGY LABORATORY CO., LTD., Atsugi (JP)

(72) Inventors: Ryo Hatsumi, Kanagawa (JP); Tetsuji Ishitani, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 18/219,283

(22) Filed: Jul. 7, 2023

(65) Prior Publication Data
US 2023/0359076 A1 Nov. 9, 2023

Related U.S. Application Data

(60) Continuation of application No. 17/072,164, filed on Oct. 16, 2020, now Pat. No. 11,698,547, which is a (Continued)

(30) Foreign Application Priority Data

Dec. 2, 2014 (JP) .................. 2014-243995

(51) Int. Cl.
*G02F 1/1333* (2006.01)
*G02F 1/1345* (2006.01)
(Continued)

(52) U.S. Cl.
CPC ...... *G02F 1/13338* (2013.01); *H01L 27/1225* (2013.01); *H01L 27/1255* (2013.01);
(Continued)

(58) Field of Classification Search
CPC ............ G02F 1/13338; G02F 1/13624; G02F 1/134381; G02F 1/134363; G02F 1/133707; G06F 3/0412
See application file for complete search history.

(56) References Cited

U.S. PATENT DOCUMENTS 6,323,932 B1  11/2001  Zhang et al.
7,889,295 B2  2/2011  Kimura et al.
(Continued)

FOREIGN PATENT DOCUMENTS

EP  2894512 A   7/2015
JP  09-281508 A  10/1997
(Continued)

*Primary Examiner* — Jessica M Merlin
(74) *Attorney, Agent, or Firm* — NIXON PEABODY LLP; Jeffrey L. Costellia

(57) ABSTRACT

An increase in fabricating cost of a display module including a touch sensor is suppressed. A display device which includes a first substrate, a second substrate, and liquid crystal interposed between the first substrate and the second substrate includes a display portion. The display portion includes a sensor unit and a pixel. The sensor unit includes a first transistor, a first conductive film electrically connected to a gate of the first transistor, and a second conductive film. At least part of the first conductive film overlaps with at least part of the second conductive film. The pixel includes a second transistor, and a pixel electrode electrically connected to the second transistor. At least part of the pixel electrode overlaps with at least part of the first conductive film.

18 Claims, 20 Drawing Sheets

Related U.S. Application Data continuation of application No. 16/039,533, filed on Jul. 19, 2018, now Pat. No. 10,809,556, which is a division of application No. 14/948,987, filed on Nov. 23, 2015, now Pat. No. 10,031,362.

(51) Int. Cl.
 *G06F 3/041* (2006.01)
 *H01L 27/12* (2006.01)
 *H01L 29/24* (2006.01)
 *H01L 29/786* (2006.01)

(52) U.S. Cl.
 CPC .......... *H01L 29/24* (2013.01); *H01L 29/7869* (2013.01); *G02F 1/13454* (2013.01); *G06F 3/0412* (2013.01)

(56) References Cited

U.S. PATENT DOCUMENTS

| | | | |
|---|---|---|---|
| 8,106,865 B2 | 1/2012 | Yoshida et al. | |
| 8,243,027 B2 | 8/2012 | Hotelling et al. | |
| 8,786,557 B2 | 7/2014 | Noguchi et al. | |
| 9,146,412 B2 | 9/2015 | Abe et al. | |
| 9,287,411 B2 | 3/2016 | Koezuka et al. | |
| 9,335,875 B2 | 5/2016 | Noguchi et al. | |
| 9,366,896 B2 | 6/2016 | Yamazaki et al. | |
| 9,501,164 B2 | 11/2016 | Ham et al. | |
| 9,524,068 B2 | 12/2016 | Kita | |
| 9,542,047 B2 | 1/2017 | Noguchi et al. | |
| 9,671,639 B2 | 6/2017 | Abe et al. | |
| 9,927,900 B2 | 3/2018 | Abe et al. | |
| 9,997,639 B2 | 6/2018 | Koezuka et al. | |
| 10,007,133 B2 | 6/2018 | Yamazaki et al. | |
| 10,037,116 B2 | 7/2018 | Noguchi et al. | |
| 10,359,875 B2 | 7/2019 | Abe et al. | |
| 10,401,662 B2 | 9/2019 | Yamazaki et al. | |
| 10,516,062 B2 | 12/2019 | Koezuka et al. | |
| 10,585,517 B2 | 3/2020 | Abe et al. | |
| 10,768,755 B2 | 9/2020 | Noguchi et al. | |
| 10,838,533 B2 | 11/2020 | Abe et al. | |
| 11,355,648 B2 | 6/2022 | Koezuka et al. | |
| 2008/0158461 A1* | 7/2008 | Kenmochi | G06F 3/0412 349/48 |
| 2010/0079406 A1 | 4/2010 | Chen et al. | |
| 2013/0162570 A1 | 6/2013 | Shin et al. | |
| 2013/0257794 A1 | 10/2013 | Lee et al. | |
| 2014/0028612 A1 | 1/2014 | Ahn et al. | |
| 2014/0104508 A1 | 4/2014 | Yamazaki et al. | |
| 2014/0111471 A1 | 4/2014 | Zhao | |
| 2014/0285732 A1 | 9/2014 | Tanabe et al. | |
| 2015/0015538 A1* | 1/2015 | Tanaka | G06F 3/0445 345/174 |
| 2015/0220174 A1 | 8/2015 | Mu et al. | |
| 2015/0242033 A1* | 8/2015 | Ham | G09G 3/3648 345/174 |
| 2015/0310793 A1 | 10/2015 | Kawashima et al. | |
| 2015/0346776 A1 | 12/2015 | Miyake | |
| 2015/0349041 A1 | 12/2015 | Miyake | |
| 2015/0372026 A1 | 12/2015 | Sato | |
| 2018/0299995 A1 | 10/2018 | Noguchi et al. | |
| 2020/0341571 A1 | 10/2020 | Noguchi et al. | |

FOREIGN PATENT DOCUMENTS

| | | |
|---|---|---|
| JP | 2003-196023 A | 7/2003 |
| JP | 2008-158461 A | 7/2008 |
| JP | 2009-003916 A | 1/2009 |
| JP | 2009-116058 A | 5/2009 |
| JP | 2009-199093 A | 9/2009 |
| JP | 2009-244958 A | 10/2009 |
| JP | 2009-301006 A | 12/2009 |
| JP | 2013-231894 A | 11/2013 |
| JP | 2013-246289 A | 12/2013 |
| JP | 2014-095892 A | 5/2014 |
| JP | 2014-095895 A | 5/2014 |
| JP | 2014-103390 A | 6/2014 |
| KR | 2011-0105136 A | 9/2011 |
| KR | 10-1349915 | 1/2014 |
| WO | WO-2009/119664 | 10/2009 |
| WO | WO-2013/175726 | 11/2013 |

* cited by examiner

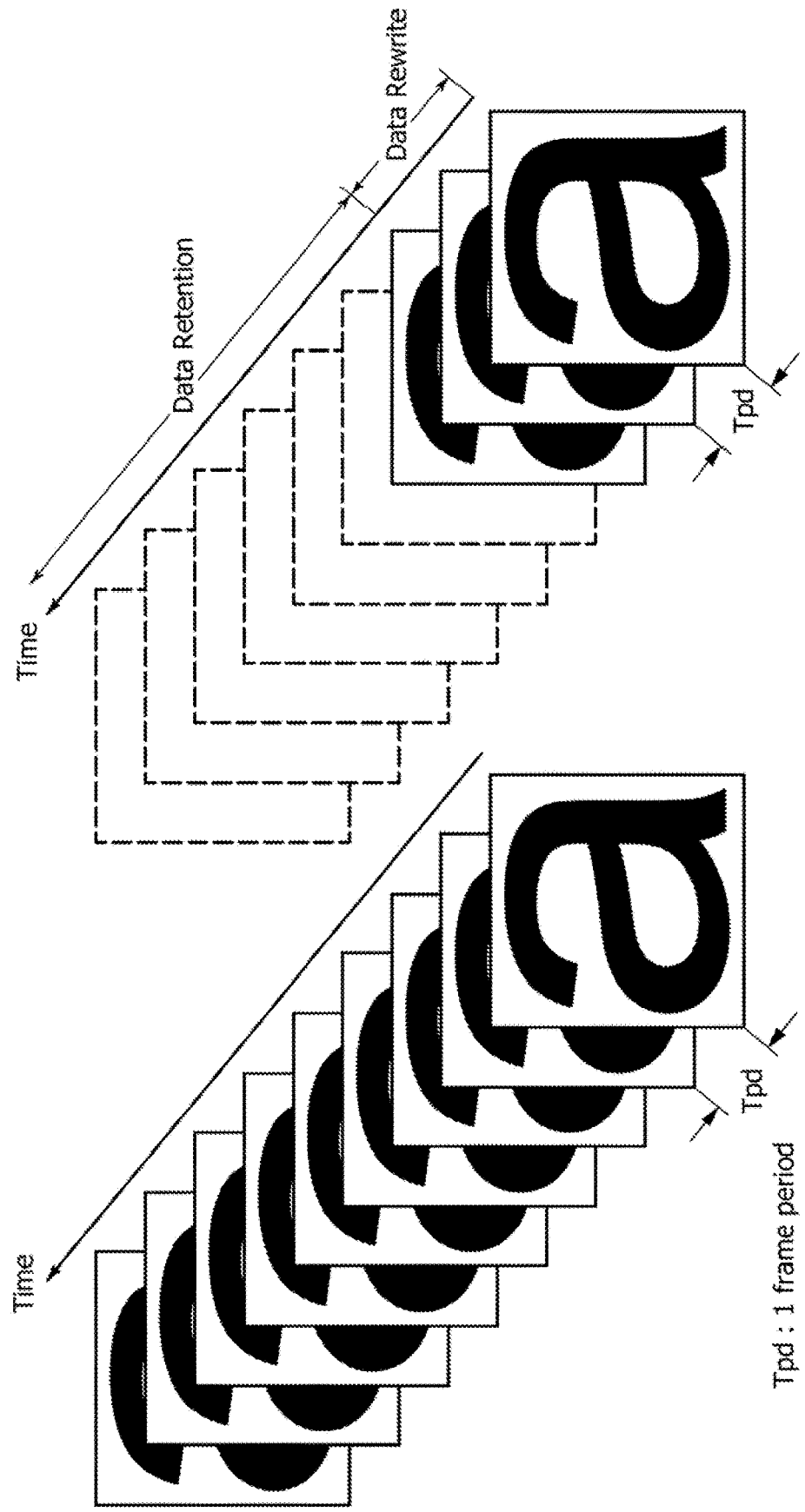

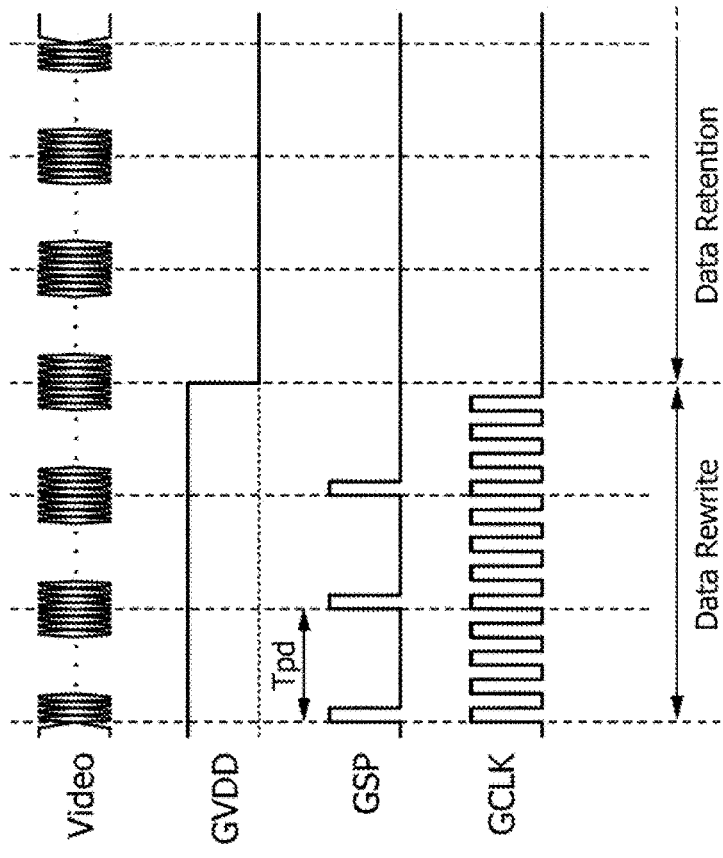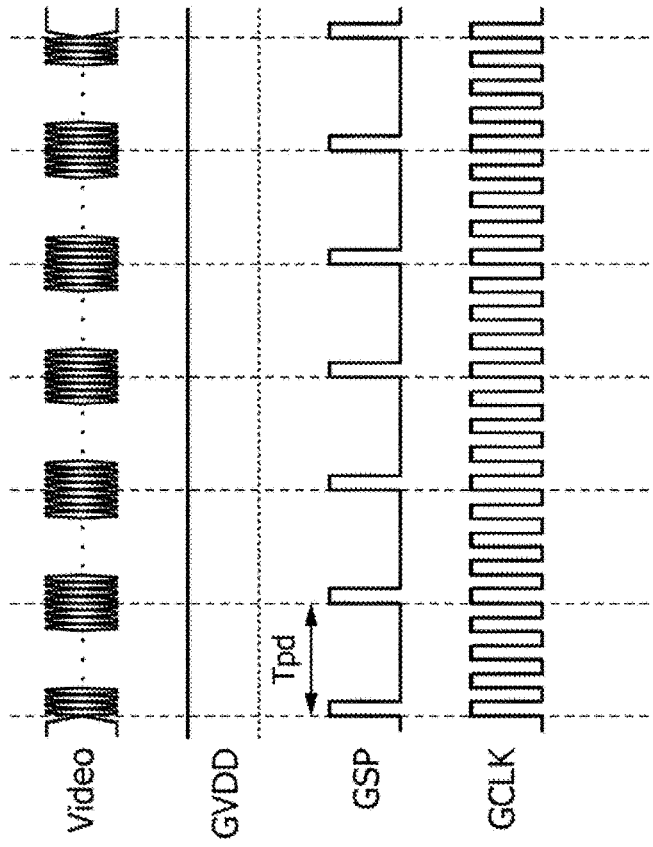
FIG. 5A
FIG. 5B

Electron beam incident to the sample surface along a direction parallel to the surface Electron beam incident to the sample surface along a direction perpendicular to the surface

SEMICONDUCTOR DEVICE AND DISPLAY DEVICE

BACKGROUND OF THE INVENTION

1. Field of the Invention

One embodiment of the present invention relates to a touch sensor. Another embodiment of the present invention relates to a display device including a touch sensor or a display panel, or a touch sensor and a display panel in combination.

Note that the term "display panel" in this specification and the like means all display devices such as a liquid crystal panel, an organic EL panel, and an inorganic EL panel. The term "semiconductor device" means all devices which can operate by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, and an electronic device may have a semiconductor device. In addition, a display device including a touch sensor and a display panel is referred to as a display module in some cases.

Note that one embodiment of the present invention is not limited to the above technical field. One embodiment of the invention disclosed in this specification and the like relates to an object, a method, or a fabricating method. One embodiment of the present invention relates to a process, a machine, manufacture, or a composition of matter. Thus, more specific examples of the technical field of one embodiment of the present invention disclosed in this specification include a semiconductor device, a display device, a light-emitting device, an electronic device, an input device, an input/output device, a method for driving any of them, and a method for fabricating any of them.

2. Description of the Related Art

As a flat panel display, a display device including a liquid crystal is known. An electronic device in which the display device is used for a display portion is known. Such an electronic device includes an input portion used for operating the electronic device, for example.

A touch sensor is known as an example of the input portion. An electronic device including a touch sensor overlapping with a display panel, in which display images can be changed by an input with the use of the touch sensor, has been desired. In the touch sensor, a capacitive touch technology, a resistive touch technology, an optical touch technology, and the like are known as its method for detecting an input signal.

REFERENCE

Patent Document

[Patent Document 1] Japanese Published Patent Application No. H09-281508

SUMMARY OF THE INVENTION

When a display module including a touch sensor is fabricated, a surface of a display portion included in a display panel for displaying images is apart from a detection surface of a touch sensor for detecting input signals because a touch panel is provided over a display panel with an adhesive layer interposed therebetween. Thus, some problems arise in that input is not smoothly performed, for example. Specifically, when the display surface is seen diagonally through a touch sensor, icons displayed on the display surface deviate from the sensing positions of the touch panel, which inhibits an accurate input.

In view of the above technical background, an object of one embodiment of the present invention is to provide a display module including a touch sensor in which wrong input can be reduced. Another object of one embodiment of the present invention is to improve the reliability of a display module including a touch sensor.

When a display module including a touch sensor is fabricated, a touch sensor overlaps with a display panel, which makes it difficult to reduce the thickness. An object of one embodiment of the present invention is to reduce the thickness of a display module including a touch sensor. Another object of one embodiment of the present invention is to reduce the weight of a display module including a touch sensor.

When a display module including a touch sensor is fabricated, a touch sensor and a display panel are fabricated separately and then need to be combined with each other, which leads to an increase in fabricating cost. An object of one embodiment of the present invention is to prevent an increase in fabricating cost of a display module including a touch sensor.

Another object of one embodiment of the present invention is to provide a novel structure of a display module including a touch sensor. Another object of one embodiment of the present invention is to provide a novel touch sensor. Another object of one embodiment of the present invention is to provide a novel display. Another object of one embodiment of the present invention is to provide a novel display module.

Note that the descriptions of these objects do not disturb the existence of other objects. One embodiment of the present invention does not necessarily solve all the objects. Other objects will be apparent from and can be derived from the description of the specification, the drawings, the claims, and the like.

In one embodiment of the present invention, a display device which includes a first substrate, a second substrate, and liquid crystal interposed between the first substrate and the second substrate includes a display portion. The display portion includes a sensor unit and a pixel. The sensor unit includes a first transistor, a first conductive film electrically connected to a gate of the first transistor, and a second conductive film. At least part of the first conductive film overlaps with at least part of the second conductive film. The pixel includes a second transistor, and a pixel electrode electrically connected to the second transistor. At least part of the pixel electrode overlaps with at least part of the first conductive film.

In another embodiment of the present invention, a display device which includes a first substrate, a second substrate, and liquid crystal interposed between the first substrate and the second substrate includes a display portion. The display portion includes a sensor unit and a pixel. The sensor unit includes a first transistor, a first conductive film electrically connected to a gate of the first transistor, and a second conductive film. The first transistor and the first conductive film are provided between the first substrate and the liquid crystal. The second conductive film is provided so as to face the first conductive film with the first substrate interposed therebetween. At least part of the first conductive film overlaps with at least part of the second conductive film. The pixel includes a second transistor, and a pixel electrode electrically connected to the second transistor. At least part of the pixel electrode overlaps with at least part of the first conductive film.

In another embodiment of the present invention, a display device which includes a first substrate, a second substrate, and liquid crystal interposed between the first substrate and the second substrate includes a display portion. The display portion includes a sensor unit and a pixel. The sensor unit includes a first transistor, a first conductive film electrically connected to a gate of the first transistor, and a second conductive film. The first transistor and the first conductive film are provided between the first substrate and the liquid crystal. The second conductive film is provided so as to face the first conductive film with the liquid crystal interposed therebetween. At least part of the first conductive film overlaps with at least part of the second conductive film. The pixel includes a second transistor, and a pixel electrode electrically connected to the second transistor. At least part of the pixel electrode overlaps with at least part of the first conductive film.

In another embodiment of the present invention, a display device which includes a first substrate, a second substrate, and liquid crystal interposed between the first substrate and the second substrate includes a display portion. The display portion includes a sensor unit and a pixel. The sensor unit includes a first transistor, a first conductive film electrically connected to a gate of the first transistor, and a second conductive film. At least part of the first conductive film is adjacent to at least part of the second conductive film. The pixel includes a second transistor, and a pixel electrode electrically connected to the second transistor. At least part of the pixel electrode overlaps with at least part of the first conductive film.

In the above, the first transistor is preferably formed in the same fabrication process at the same time as the second transistor.

According to one embodiment of the present invention, a sensor unit can be formed at the same time as a pixel, which can reduce fabricating cost of a display device integrated with a sensor. The thickness of a display device integrated with a sensor can be reduced. The weight of a display device integrated with a sensor can be reduced. The thickness and weight of a display device integrated with an active matrix sensor can be reduced. A highly reliable display device integrated with a sensor whose detection sensitivity is improved can be provided. According to another embodiment of the present invention, a novel structure of a display module including a touch sensor can be provided. Another embodiment of the present invention can provide a novel touch sensor. Another embodiment of the present invention can provide a novel display. Another embodiment of the present invention can provide a novel display module.

Note that the description of these effects does not disturb the existence of other effects. One embodiment of the present invention does not necessarily achieve all the effects. Other effects will be apparent from and can be derived from the description of the specification, the drawings, the claims, and the like.

BRIEF DESCRIPTION OF THE DRAWINGS

In the accompanying drawings:
FIGS. 4A and 4B illustrate examples of driving methods;
FIGS. 5A and 5B illustrate examples of driving methods.

DETAILED DESCRIPTION OF THE INVENTION

Figures 1A, 1B:
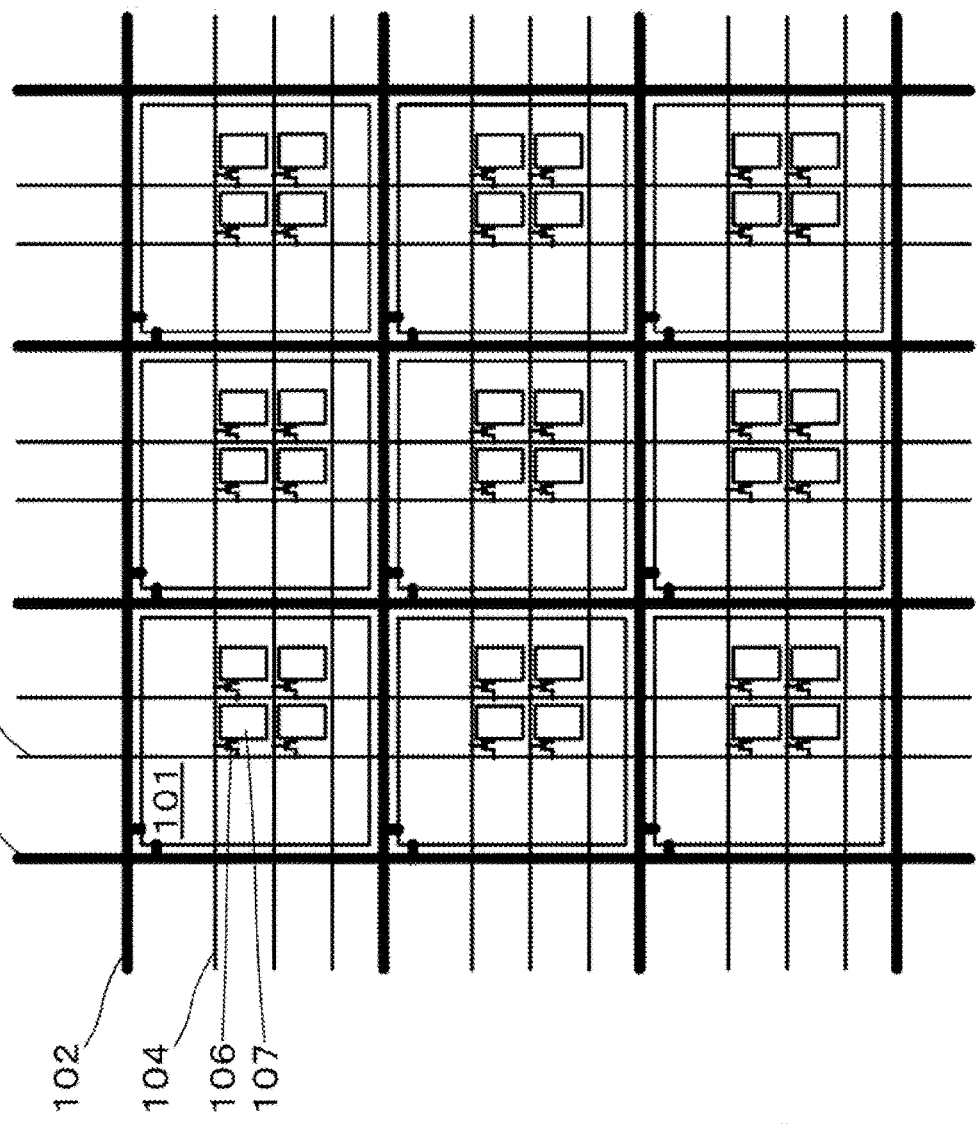
FIGS. 1A and 1B illustrate structure examples of a display device.

Hereinafter, embodiments of the present invention will be described in detail. Note that the present invention is not limited to the description below, and it is easily understood by those skilled in the art that a variety of changes and modifications can be made without departing from the spirit and scope of the present invention. Therefore, the present invention is not construed as being limited to the description of the embodiments given below.

Note that in the structures of the invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

Note that in each drawing described in this specification, the size, the film thickness, or the region of each component is exaggerated for clarity in some cases. Therefore, embodiments of the present invention are not limited to such a scale.

Note that in this specification and the like, ordinal numbers such as "first," "second," and the like are used in order to avoid confusion among components and do not limit the number.

A transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT).

A "source" of a transistor means a source region that is part of a semiconductor film or a source electrode connected to the semiconductor film. Similarly, a "drain" of the transistor means a drain region that is part of the semiconductor film or a drain electrode connected to the semiconductor film. A "gate" means a gate electrode.

The terms "source" and "drain" of a transistor interchange with each other depending on the conductivity type of the transistor or levels of potentials applied to terminals. In general, in an n-channel transistor, a terminal to which a lower potential is applied is called a source, and a terminal to which a higher potential is applied is called a drain. Further, in a p-channel transistor, a terminal to which a lower potential is applied is called a drain, and a terminal to which a higher potential is applied is called a source. In this specification, although connection relation of the transistor is described assuming that the source and the drain are fixed in some cases for convenience, actually, the names of the source and the drain interchange with each other depending on the relation of the potentials.

In addition, even when different components are connected to each other in a circuit diagram, there is actually a case where one conductive film has functions of a plurality of components such as a case where part of a wiring serves as an electrode. The term "connection" also means such a case where one conductive film has functions of a plurality of components.

Embodiment 1

In this embodiment, a touch sensor and a liquid crystal display device integrated with a touch sensor, of one embodiment of the present invention, are described (FIGS. 1A and 1B).

FIG. 1A illustrates a schematic view of a display device integrated with an active matrix touch sensor of one embodiment of the present invention. A display device 10 integrated with an active matrix touch sensor of one embodiment of the present invention includes a display region 100, a gate line 104 provided in the display region 100, a gate line driver circuit 20 electrically connected to the gate line 104, a source line 105 provided in the display region 100, a source line driver circuit 30 electrically connected to the source line 105, a bus line 102 provided in the display region 100, a sensor unit driver circuit 40 for the active matrix touch sensor electrically connected to the bus line 102, a bus line 103 provided in the display region 100, a conversion circuit 50 for the active matrix touch sensor electrically connected to the bus line 103. The display device 10 includes a flexible printed circuit (FPC) 60.

A chip on glass (COG) method may be used as a method for mounting the sensor unit driver circuit 40, the conversion circuit 50, and the source line driver circuit 30. The sensor unit driver circuit 40, the conversion circuit 50, and the source line driver circuit 30 may be formed on one IC chip or formed on respective IC chips. All or part of the sensor unit driver circuit 40 may be formed over the display device 10 using a thin film transistor. All or part of the conversion circuit 50 may be formed over the display device 10 using a thin film transistor. All or part of the source line driver circuit 30 may be formed over the display device 10 using a thin film transistor.

FIG. 1B illustrates a schematic view of the display region 100 of the display device integrated with an active matrix touch sensor. The display region 100 includes at least the active matrix touch sensor, the gate line 104, the source line 105, a transistor 106, and a pixel electrode 107. A gate of the transistor 106 is electrically connected to the gate line 104. One of a source and a drain of the transistor 106 is electrically connected to the source line 105. The other of the source and the drain of the transistor 106 is electrically connected to the pixel electrode 107. The active matrix touch sensor includes the bus line 102, the bus line 103, and a sensor unit 101. The bus line 102 is electrically connected to the sensor unit 101. The bus line 103 is electrically connected to the sensor unit 101. Examples of the bus line 102 include a wiring VRES, a wiring RES, a scanning line GL (k), a wiring CS, a wiring VPI (see FIG. 6). Examples of the bus line 103 include a signal line DL (n) (see FIG. 6).

The active matrix touch sensor of one embodiment of the present invention includes the sensor unit 101. The sensor unit 101 includes a first transistor and a first capacitor. The first capacitor includes a first electrode, a second electrode, and a dielectric provided therebetween, for example. At least part of the second electrode of the first capacitor overlaps with part of a pixel electrode. A transistor which can be formed over the first substrate at the same time as when the transistor 106 is formed can be used as the first transistor. The first transistor and the transistor 106 are formed over the first substrate, which can simplify the process for fabricating the touch panel and reduce the fabricating cost.

Figure 2:
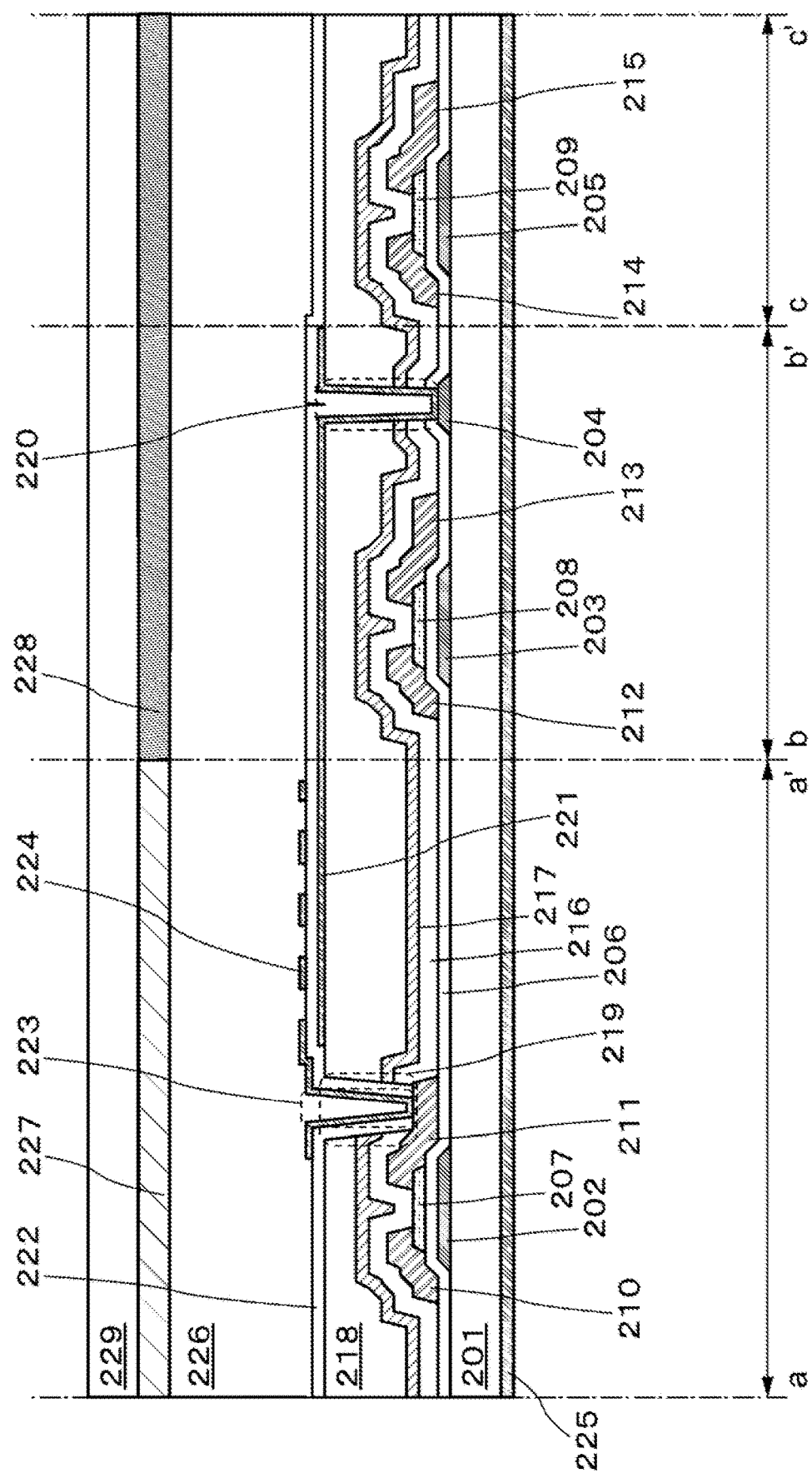
FIG. 2 illustrates a structure example of a display device.

FIG. 2 is a cross-sectional view of a liquid crystal display device integrated with an active matrix touch sensor of one embodiment of the present invention. In FIG. 2, a cross section a-a' illustrates part of a display element; b-b', part of a sensor unit; and c-c', part of a circuit.

The liquid crystal display device integrated with an active matrix touch sensor of one embodiment of the present invention includes conductive films 202, 203, 204, and 205 over a substrate 201. The conductive films 202, 203, and 205 each function as a gate electrode of a transistor. An insulating film 206 is provided over the conductive films 202, 203, 204, and 205. Part of the insulating film 206 can function as a gate insulating film of the transistor. Semiconductor films 207, 208, and 209 are provided over the insulating film 206. Conductive films 210 and 211 are provided over the semiconductor film 207. Conductive films 212 and 213 are provided over the semiconductor film 208. Conductive films 214 and 215 are provided over the semiconductor film 209. The conductive films 210, 211, 212, 213, 214, and 215 each can function as a source or a drain of a transistor. Insulating films 216, 217, and 218 are provided over the conductive films 210, 211, 212, 213, 214, and 215. The insulating film 218 is preferably an insulator having planarity. The insulating films 216, 217, and 218 have openings 219 and 220. A conductive film 221 is provided over the insulating film 218. The conductive film 221 is electrically connected to the conductive film 204 through the opening 220. At least part of the conductive film 221 functions as a common electrode. An insulating film 222 is provided over the conductive film 221. An opening 223 is provided into the insulating film 222. A conductive film 224 is provided over the insulating film 222. The conductive film 224 is electrically connected to the conductive film 211 through the opening 223. At least part of the conductive film 224 can function as a pixel electrode. The conductive film 224 includes at least one slit, whereby the liquid crystal can be controlled by an electric field generated between the conductive films 224 and 221. At least part of the conductive film 221 overlaps with at least part of the conductive film 224 with the insulating film 222 interposed therebetween and functions as an electrode forming a storage capacitor for storing a potential of the pixel electrode for a predetermined period. A liquid crystal layer 226 is provided over the conductive film 224. A coloring film 227 and a light-blocking film 228 are provided over the liquid crystal layer 226. As the color filter 227, a red (R) color filter, a green (G) color filter, and a blue (B) color filter can be used. These colors may also be combined with a white (W) or yellow (Y) color filter. A substrate 229 is provided over the coloring film 227 and the light-blocking film 228. A conductive film 225 is provided under the substrate 201.

The conductive film 225 overlaps with the conductive film 221 at least with the substrate 201 interposed therebetween and functions as the first capacitor of the sensor unit 101. A transparent conductive material is preferably used as the conductive films 221, 224, and 225.

At least part of the conductive film 221 overlaps with at least part of the conductive film 225 with a dielectric interposed therebetween, thereby forming a capacitor. In the active matrix touch sensor of one embodiment of the present invention, capacitance formed between an object to be detected such as a finger or a stylus and the conductive film 221 is measured to detect touch motion. Specifically, touch motion can be detected by measuring a change in the potential of the conductive film 221 due to capacitance formed between the object to be detected and the conductive film 221 by the touch motion when a predetermined potential difference is applied between the conductive film 221 and the conductive film 225.

At least part of the conductive film 221 also functions as an electrode of a storage capacitor for storing a voltage of the pixel electrode for a predetermined period and further functions as an electrode of a first capacitor provided in the sensor unit 101 for detecting touch motion.

The liquid crystal display device integrated with the active matrix touch sensor of one embodiment of the present invention can detect positional information based on the change in capacitance at the time of touch motion. Images can be displayed on the display region. Because the active matrix touch sensor, the gate line 104, the source line 105, the transistor 106, and the pixel electrode 107 are formed over the substrate 201, a thin and light liquid crystal display device integrated with the active matrix touch sensor can be obtained. A transistor used for the active matrix touch sensor can be formed at the same time as the transistor 106 in the pixel, which can simplify the fabricating process and reduce the fabricating cost.

A structure of a transistor used for the liquid crystal display device integrated with the active matrix touch sensor of one embodiment of the present invention is not particularly limited and transistors with various structures can be used. Although the bottom-gate transistor is shown in this embodiment, the transistor is not limited to this. For example, a top-gate transistor may be used.

At least part of this embodiment can be implemented in combination with any of the embodiments described in this specification as appropriate.

Embodiment 2

Figure 3:
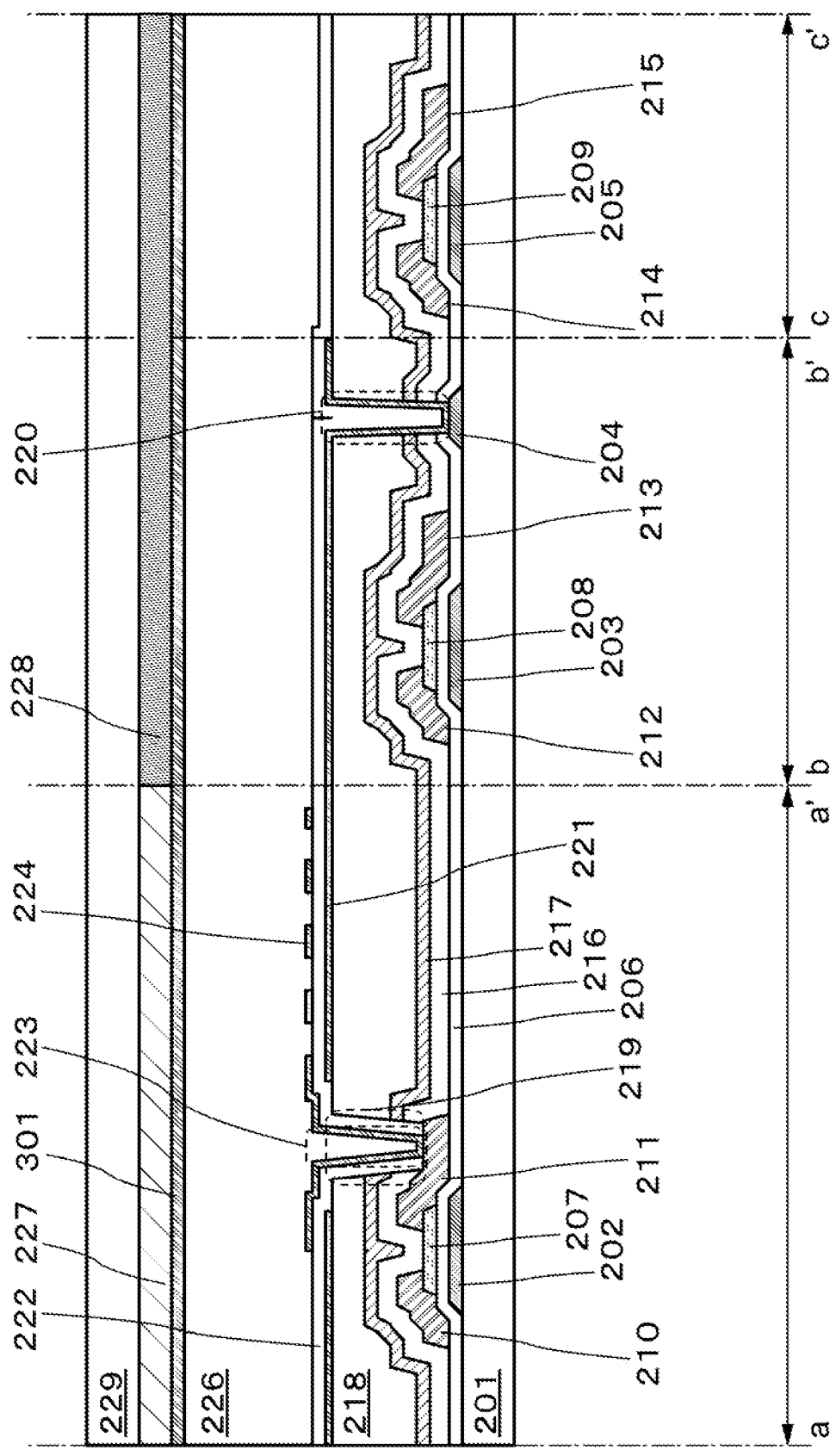
FIG. 3 illustrates a structure example of a display device.

FIG. 3 is a cross-sectional view of a liquid crystal display device integrated with an active matrix touch sensor of one embodiment of the present invention. In FIG. 3, a cross section a-a' illustrates part of a display element; b-b', a sensor unit; and c-c', part of circuit.

FIG. 2 illustrates a structure in which the conductive film 225 is provided under the substrate 201. FIG. 3 illustrates an example in which a conductive film 301 corresponding to the conductive film 225 is provided on the substrate 229 side. Since the structure provided over the substrate 201 in FIG. 3 is similar to that of FIG. 2 except for the conductive film 225, the description is omitted. An example in which a conductive film 301 is provided over the liquid crystal is described in FIG. 3.

In one embodiment of the present invention, the conductive film 301 overlaps with the conductive film 224 with the liquid crystal layer 226 interposed therebetween. In the structure of FIG. 3, the liquid crystal is controlled by the conductive films 221, 224, and 301. The specific resistivity of the liquid crystal material used for the liquid crystal is preferably greater than or equal to $1.0 \times 10^{13}$ Ω·cm, further preferably greater than or equal to $1.0 \times 10^{15}$ Ω·cm. A negative liquid crystal material is preferably used for the liquid crystal. With this structure, the liquid crystal display device causes less change in transmittance of the liquid crystal and few image flickers perceivable by users even when the number of operations for writing image signals in a given period is reduced. Specifically, the liquid crystal molecules are controlled by an electric field generated between the conductive films 224 and 221, and the use of the conductive film 301 makes it possible for the alignment of the liquid crystal to be controlled more stably. A potential of the conductive film 301 is preferably equal to that of the conductive film 221. A transparent conductive material is preferably used as the conductive film 301.

A structure of a transistor used for the liquid crystal display device integrated with the active matrix touch sensor of one embodiment of the present invention is not particularly limited and transistors with various structures can be used. Although bottom-gate transistors are shown in this embodiment, this embodiment is not limited to this. For example, top-gate transistors may be used.

At least part of this embodiment can be implemented in combination with any of the embodiments described in this specification as appropriate.

Embodiment 3

In this embodiment, a driving method by which the frequency of screen updating is reduced as much as possible is described as a method for driving a liquid crystal of one embodiment of the present invention.

A liquid crystal display device to which the driving method is applied displays images by at least two driving methods (modes). One is a driving method in which screen updating is successively performed. This method is called "normal driving." The other is a driving method in which screen writing is stopped after screen writing processing is executed. This method is called "idling stop (IDS) driving. In a "normal mode (state)" and an "IDS mode (state)," the liquid crystal display device is operated by the normal drive and the IDS drive, respectively.

Moving images are displayed by the normal drive. Still images are displayed by the normal drive or the IDS drive. For displaying still images, the same picture is displayed; therefore, screen updating is not necessarily performed successively. The liquid crystal display device is operated by the IDS driving for displaying still images, which can reduce flicker in the images. The power consumption can also be reduced. The normal driving and the IDS driving are described below with reference to FIGS. 4A and 4B and FIGS. 5A and 5B.

FIG. 4A shows a display method of still images by the normal drive, and FIG. 4B shows a display method of still images by the IDS drive.

FIGS. 5A and 5B are timing chart examples of the normal driving and the IDS driving, respectively. In FIGS. 5A and 5B, Video is an image signal input to the liquid crystal display device, which is an image data signal supplied to a source line from a source line driver circuit. GVDD is a power supply voltage on a high potential side of the gate line driver circuit.

In the normal drive, screen (data) is updated successively. Specifically, when the frame frequency is 60 Hz, one frame period is about 1/60 seconds; thus, screen is updated every about 1/60 second.

In the IDS driving, processing performed as shown in the timing chart includes data updating processing (also referred to as writing processing) and data retention processing.

Regarding the frequency of data updating, data updating is executed once per frame period (period Tpd) as in the normal drive, whereby data is written to a pixel. After data is written, data updating is stopped. A pixel transistor is turned off so that data is retained.

The number of data updating operations in one data updating processing may be one or more. FIG. 4B and FIG. 5B each show an example in which the number of data updating operations is three.

The number of data updating operations can be set in consideration of the length of the one frame period. The time required for data updating operation is at most 1 second, and is preferably about less than or equal to 0.5 seconds, or about less than or equal to 0.2 seconds.

The number of data writing operations is preferably adjusted so that the polarity of Video signal retained in the pixel in the data retention period is opposite to that of Video signal retained in the pixel in the preceding data retention period. This can inhibit degradation of the liquid crystal due to the IDS driving.

As can be seen from FIGS. 4A and 4B and FIGS. 5A and 5B, in the IDS mode, a still image can be displayed while data is updated much less frequently than in the normal mode. Accordingly, display of still images in the IDS mode results in reduced screen flicker and less eye strain. In the data retention period, the gate line driver circuit and the source line driver circuit also stop operating; thus, power consumption can be reduced.

At least part of this embodiment can be implemented in combination with any of the embodiments described in this specification as appropriate.

Embodiment 4

In this embodiment, a structure example of a touch sensor of one embodiment of the present invention and a driving method thereof is described with reference to drawings.

Figure 6:
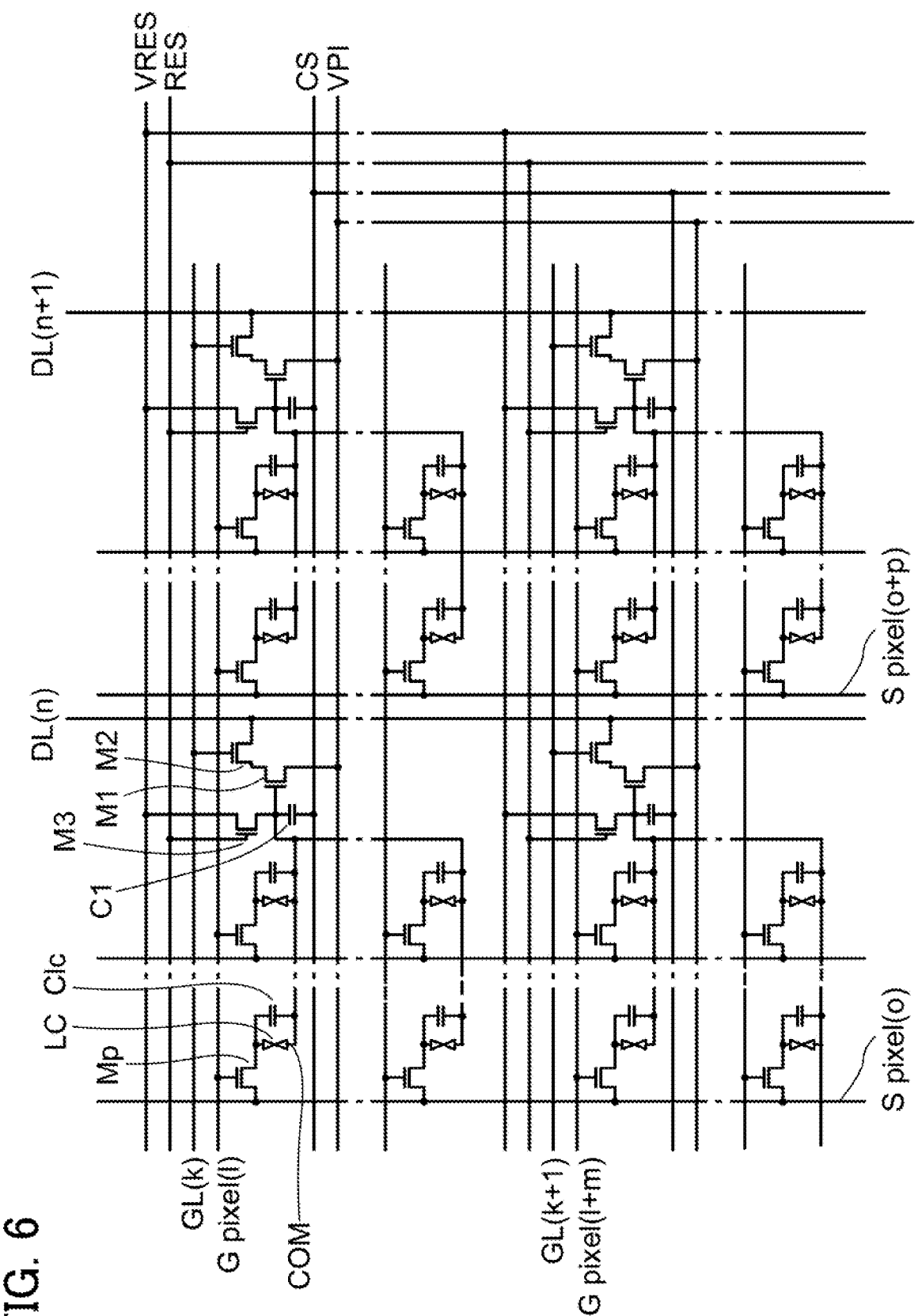
FIG. 6 illustrates a structure example of a circuit.
Figure 7:
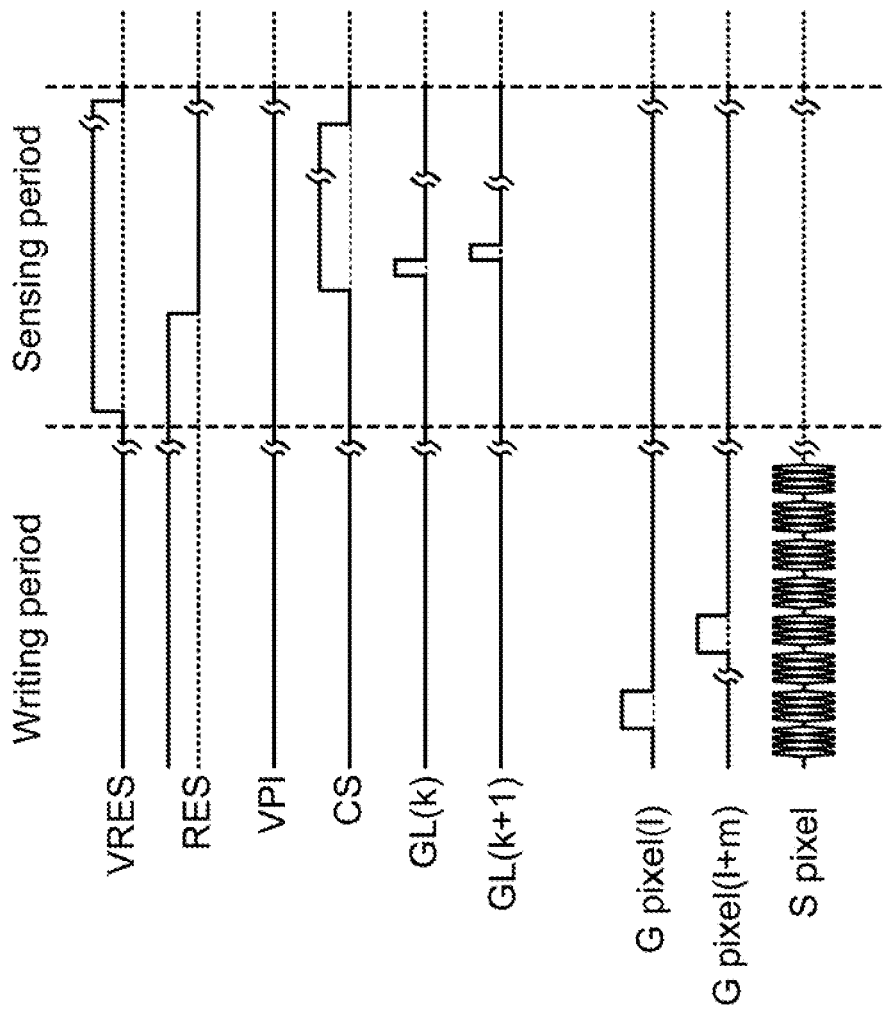
FIG. 7 illustrates an example of driving method.

FIG. 6 illustrates a circuit diagram of a display portion including an active matrix touch sensor of one embodiment of the present invention. FIG. 7 shows an example of signals which can be input to the circuit of FIG. 6.

The display portion in FIG. 6 includes at least a sensor unit and a pixel. The sensor unit includes at least a capacitor C1, and transistors M1, M2, and M3. The pixel includes at least a liquid crystal element LC, a capacitor Clc, and a transistor Mp.

A gate line Gpixel (l) is electrically connected to a gate of the transistor Mp. A source line Spixel (o) is electrically connected to one of a source and a drain of the transistor Mp (l and o are each an integer of 1 or more). The other of the source and the drain of the transistor Mp is electrically connected to a pixel electrode and a first electrode of the capacitor Clc.

A scanning line GL (k) is electrically connected to a gate of the transistor M2. A wiring DL (n) is electrically connected to one of a source and a drain of the transistor M2 (k and n are each an integer of 1 or more). A wiring VRES is electrically connected to one of a source and a drain of the transistor M3. A wiring RES is electrically connected to a gate of the transistor M3. A wiring VPI is electrically connected to one of a source and a drain of the transistor M1. A wiring CS is electrically connected to the second electrode of the capacitor C1.

The other of the source and the drain of the transistor M1 and the other of the source and the drain of the transistor M2 are electrically connected to each other. A gate of the transistor M1 is electrically connected to the other of the source and the drain of the transistor M3 and the first electrode of the capacitor C1.

A common electrode COM included in the liquid crystal element LC is electrically connected to the gate of the transistor M1. The second electrode of the capacitor Clc in the pixel portion is electrically connected to the gate of the transistor M1.

The gate line Gpixel is electrically connected to the gate line driver circuit. The source line Spixel is electrically connected to the source line driver circuit. The wiring VRES is electrically connected to a sensor unit driver circuit. The wiring RES is electrically connected to the sensor unit driver circuit. The wiring CS and the wiring VPI each may be electrically connected to the sensor unit driver circuit or electrically connected to a FPC otherwise than via the sensor unit driver circuit.

Figure 8:
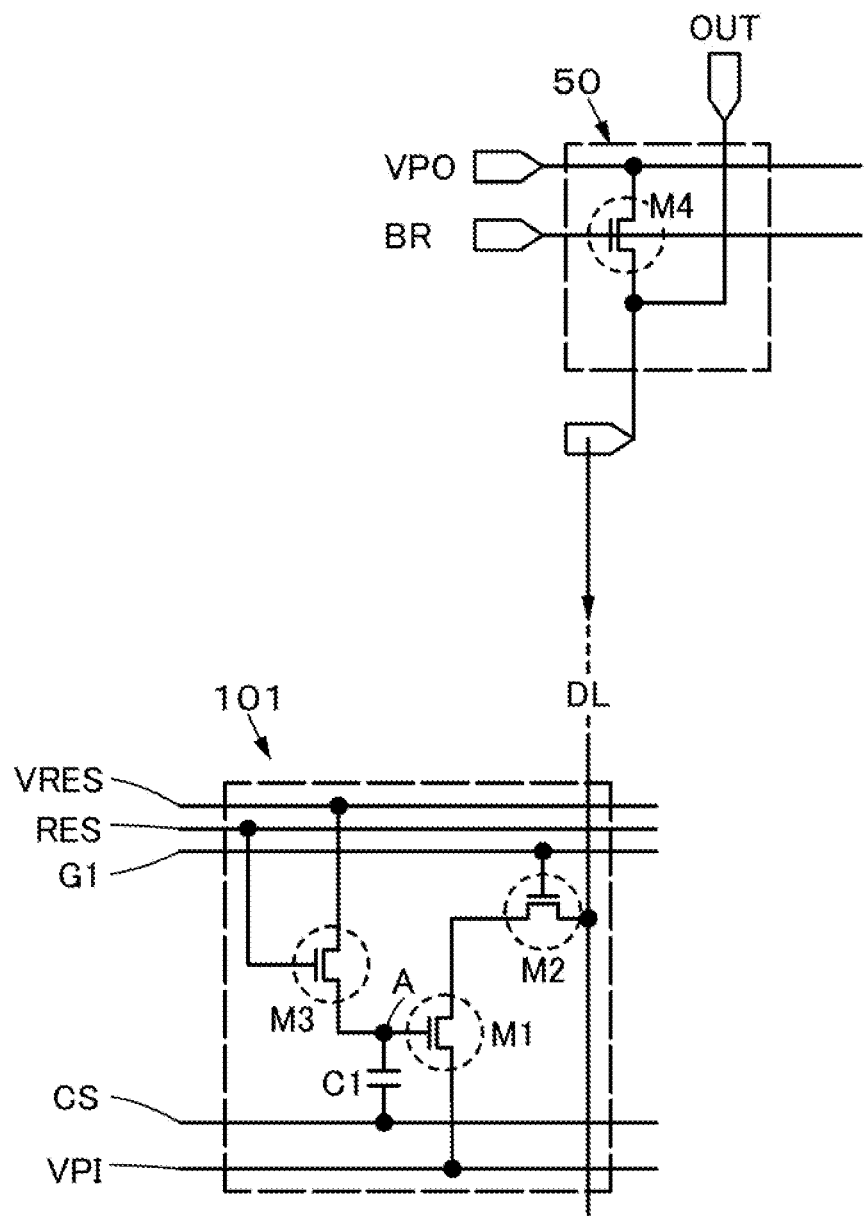
FIG. 8 illustrates a structure example of a circuit.

The wiring DL is electrically connected to a conversion circuit. Any of a variety of circuits can be used as the conversion circuit. FIG. 8 illustrates one example.

The sensor unit includes the capacitor C1 including the first electrode and the second electrode. In FIG. 2, the conductive film 225 corresponds to the second electrode and the conductive film 221 corresponds to the first electrode. In FIG. 3, the conductive film 301 corresponds to the second electrode and the conductive film 221 corresponds to the first electrode.

A driving method is described with reference to FIG. 6 and FIG. 7.

A timing chart of one frame period is shown in FIG. 7. One frame period includes a writing period and a sensing period. The writing period is a period in which image signals are written to each of the pixels of the display portion. The sensing period is a period in which touch motion is detected from the sensor unit.

[Writing Period]

First Step

When a control signal is input to the wiring RES, so that the wiring RES is selected, the transistor M3, which is electrically connected to the wiring RES, is turned on. A low potential is supplied to the wiring VRES. The potential supplied to the wiring VRES is supplied to the common electrode COM through the transistor M3 in the on state. In such a manner, the common electrode in the pixel has an electrical connection to the wiring VRES and has a constant potential during the updating period.

Second Step

The gate line Gpixel is selected. The transistor Mp, which is connected to the selected gate line Gpixel, is turned on. A video signal supplied to the source line Spixel is supplied to the pixel electrode and the capacitor Clc through the transistor Mp. In such a manner, the gate lines Gpixel in the first to the last rows are sequentially selected, and video signals are written to each of the pixel electrodes and each of the capacitors Clc. In FIG. 7, a timing chart from Gpixel (l) to Gpixel (l+m) (m is an integer of 1 or more) is shown as an example.

[Sensing Period]

Third Step

In the sensing period, none of the gate lines Gpixel is selected and the transistor Mp is turned off.

Fourth Step

The potentials of the wirings VPI and CS are low. The wiring RES is selected and the transistor M3 is turned on. A high potential is supplied to the wiring VRES and a high potential is supplied to the gate of the transistor M1. At this time, a low potential is supplied to the second electrode of the capacitor C1 electrically connected to the wiring CS, and a high potential is supplied to the first electrode of the capacitor C1 electrically connected to the gate of the transistor M1. For example, when the low potential is 0V and the high potential is 5V, a voltage of 5V is applied between the second potential and the first potential of the capacitor C1. Then, the wiring RES is not selected so that the transistor M3 is turned off, and voltages at both ends of the capacitor C1 are retained.

Fifth Step

Figure 9:
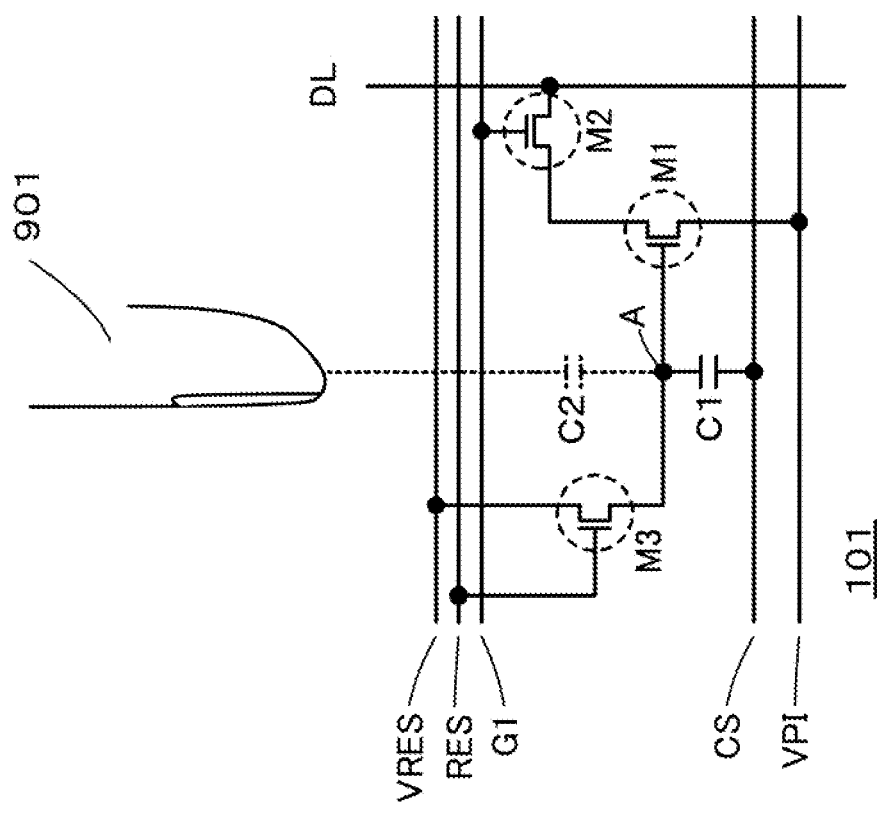
FIG. 9 illustrates a structure example of a circuit.

In the case where the capacitor C1 is put in the air, when an object whose dielectric constant is higher than that of the air, for example a human finger 901, is placed in the proximity to the first electrode of the capacitor C1, the capacitance C2 is generated between the first electrode of the capacitor C1 and the finger (see FIG. 9). In this state, the potential of the wiring CS is shifted from low to high. A gate potential of part of the transistor M1 where an object whose dielectric constant is higher than that of the air, for example a human finger, is placed in the proximity to the first electrode of the capacitor C1 is less likely to be changed compared to a gate potential of part of the transistor M1 where an object whose dielectric constant is higher than that of the air, for example a human finger, is not placed in the proximity to the first electrode of the capacitor C1. Measuring this difference determines the position of a human finger, for example. For measuring this difference, the conversion circuit in FIG. 8 can be used, for example.

In the conversion circuit 50 of FIG. 8, the transistor M4 in the conversion circuit is turned on by a signal supplied from the wirings VPO and BR while the transistor M2 in the sensor unit is turned off, so that the potential of the wiring DL is set to a determined potential. After that, the transistor M4 is turned off. Then, the transistor M2 in the sensor unit is turned on, and the change in the potential of the wiring DL is measured. After the measurement for one screen is executed, the potential of the wiring CS is shifted to low.

As described above, the operation in one frame includes the first to fifth steps.

The IDS driving in Embodiment 3 can be used in combination.

This embodiment shows an example of the touch sensor of one embodiment of the present invention. Note that one embodiment of the present invention is not limited to the above examples. For example, the touch sensor of one embodiment of the present invention can be of resistive, surface acoustic wave, infrared, electromagnetic induction, surface capacitive, or projected capacitive type.

At least part of this embodiment can be implemented in combination with any of the embodiments described in this specification as appropriate.

Embodiment 5

Figure 10:
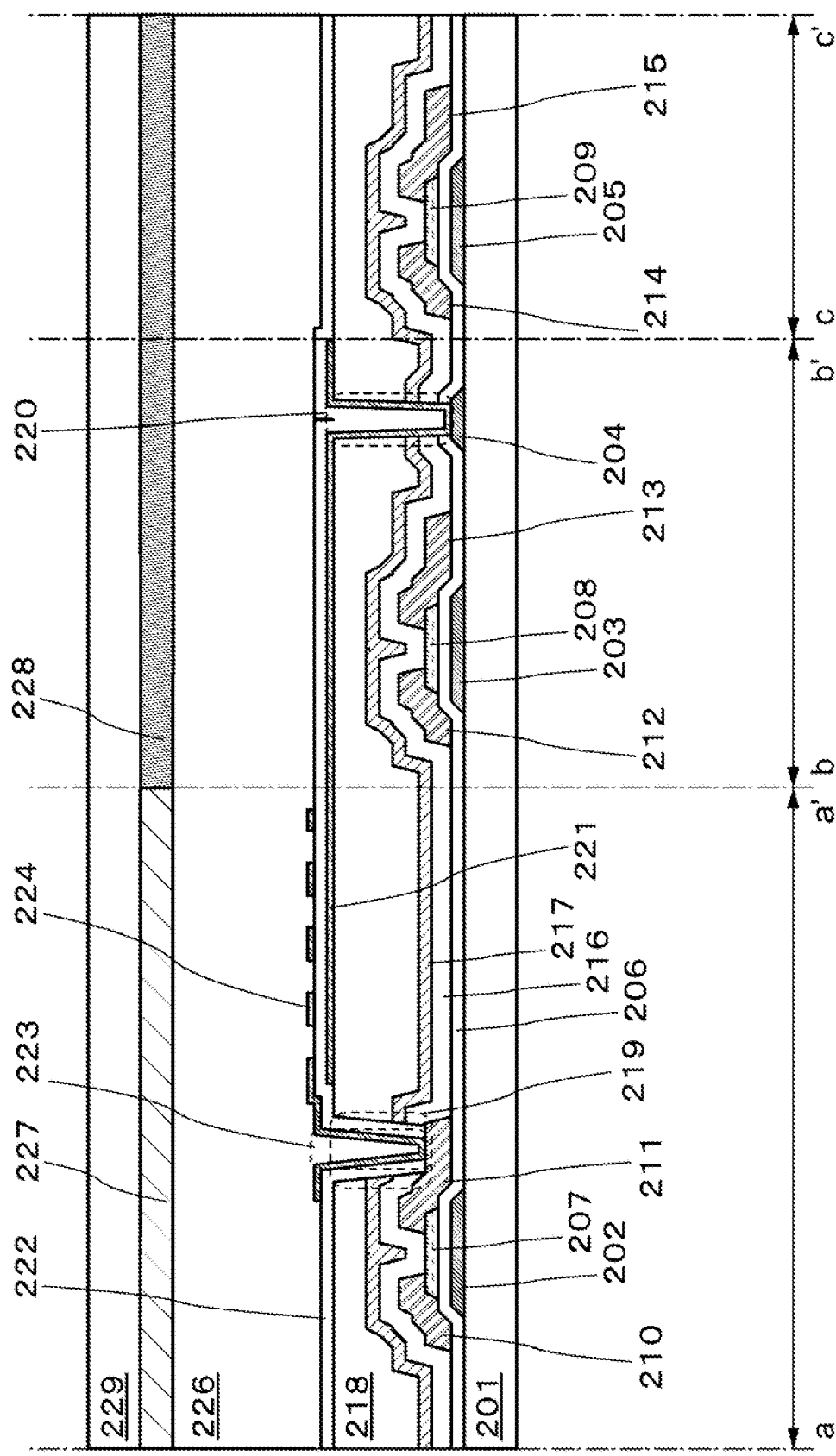
FIG. 10 illustrates a structure example of a display device.

FIG. 10 is a cross-sectional view of a liquid crystal display device integrated with an active matrix touch sensor of one embodiment of the present invention. In FIG. 10, a cross section a-a' illustrates part of a display element; b-b', a sensor unit; and c-c', part of circuit.

Figure 11:
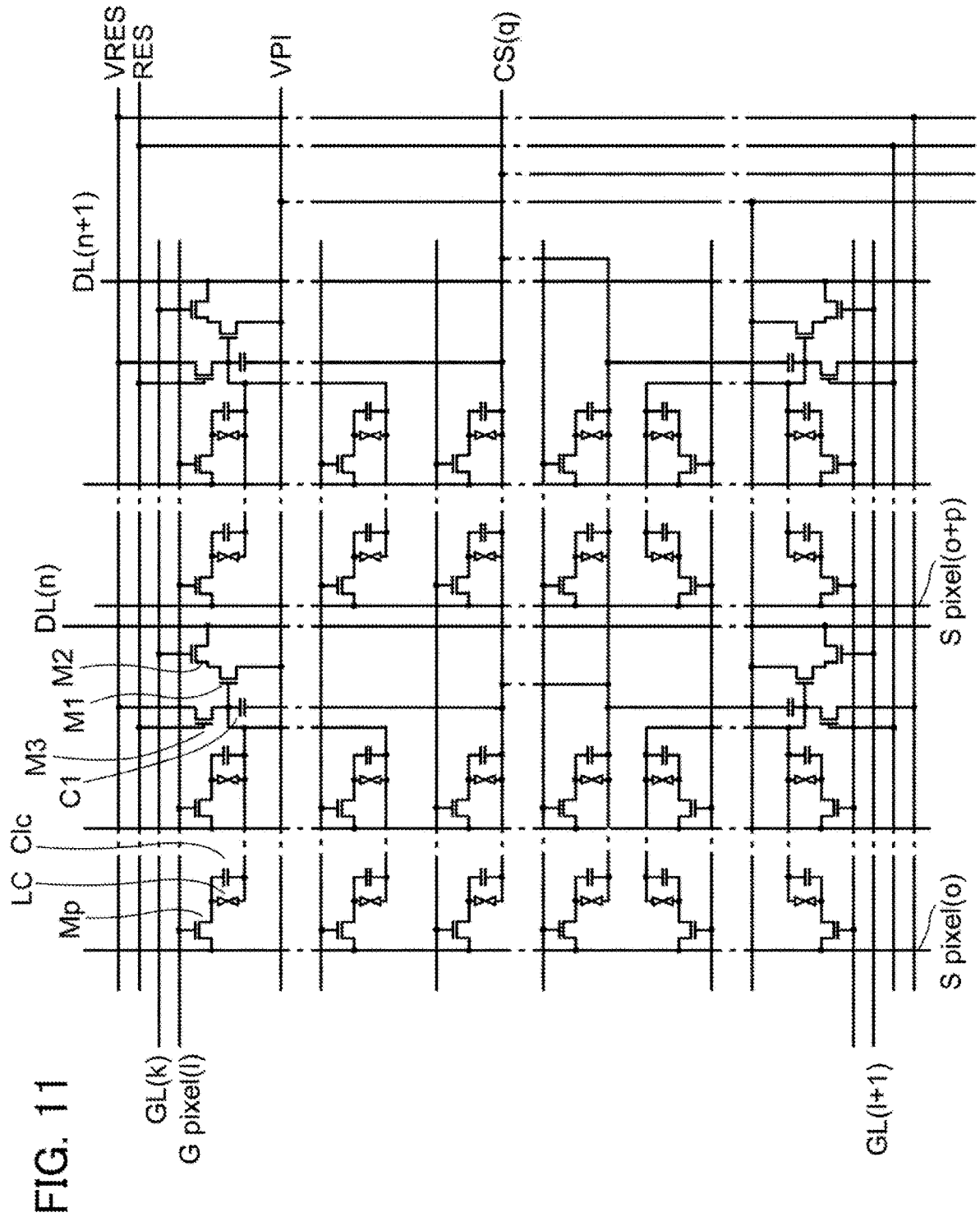
FIG. 11 illustrates a structure example of a circuit.

FIG. 2 illustrates a structure in which the conductive film 225 is provided under the substrate 201. FIG. 10 illustrates an example in which the conductive film 225 is not provided. In the circuit diagram in FIG. 6, the conductive film 225 corresponds to the wiring CS. FIG. 11 illustrates a circuit diagram of a display portion in which a layer corresponding to the conductive film 225 in FIG. 2 is not provided as illustrated in FIG. 10. The sensor unit includes the capacitor C1 including the first electrode and the second electrode. In FIG. 10, the conductive film 221 corresponds to the first electrode, and the conductive film 221 that is not connected to the transistor in the sensor unit corresponds to the second electrode. Since the stacked structure of FIG. is similar to that of FIG. 2 except for the conductive film 225, the description is omitted.

Figure 12:
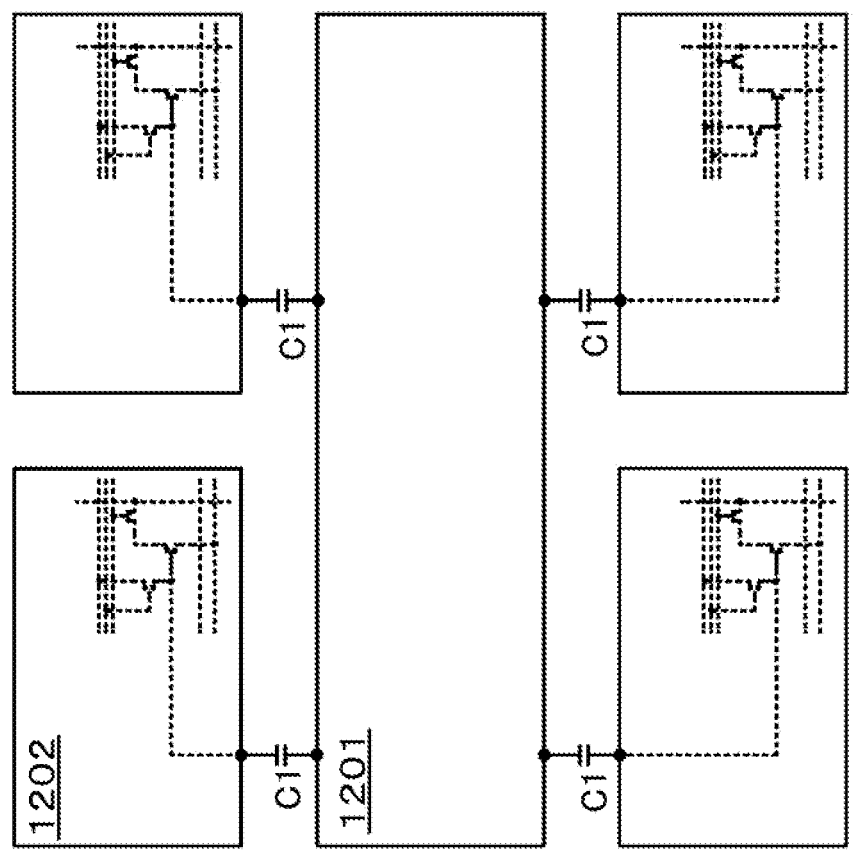
FIG. 12 illustrates a structure example of a circuit.

In FIG. 11, the common electrode of part of the pixel functions as the wiring CS. That is, although the conductive film 225 is provided in FIG. 2 to be used as the wiring CS, part of the conductive film 221 functioning as the common electrode is patterned and used as the wiring CS in FIG. 11; therefore, the conductive film 225 is not necessarily provided as the wiring CS. FIG. 12 illustrates an example of a layout of the conductive film 221. In the example in FIG. 12, an electrode 1201 corresponds to the second electrode of the capacitor C1, and an electrode 1202 corresponds to the first electrode of the capacitor C1.

FIG. 11 illustrates a circuit diagram of a display portion including an active matrix touch sensor of one embodiment of the present invention. FIG. 7 is a timing chart of one example of signals which can be input to the circuit in FIG. 11.

The IDS driving in Embodiment 3 can be used in combination.

This embodiment shows an example of the touch sensor of one embodiment of the present invention. Note that one embodiment of the present invention is not limited to the above examples. For example, the touch sensor of one embodiment of the present invention can be of resistive, surface acoustic wave, infrared, electromagnetic induction, surface capacitive, or projected capacitive type.

At least part of this embodiment can be implemented in combination with any of the embodiments described in this specification as appropriate.

Embodiment 6

An insulator, a semiconductor, and a conductor that can be favorably used for a semiconductor device of one embodiment of the present invention, and a formation method and a processing method thereof are described in this embodiment.

The insulator can be formed with a single layer or a stack using silicon oxide, silicon oxynitride, silicon nitride oxide, silicon nitride, aluminum oxide, aluminum oxynitride, aluminum nitride oxide, aluminum nitride, and the like.

As a high-dielectric constant material (also referred to as a high-k material) that can be used as the insulator, a metal oxide such as a tantalum oxide, a hafnium oxide, a hafnium silicate oxide, a zirconium oxide, an aluminum oxide, or a titanium oxide; or a rare-earth oxide such as a lanthanum oxide, can be used.

In the case of using an oxide semiconductor for the semiconductor, an oxide material from which oxygen is partly released due to heating is preferably used for the insulator which is in contact with the oxide semiconductor.

As the oxide material from which oxygen is released due to heating, oxide containing oxygen in excess of the stoichiometric composition is preferably used, for example. The oxide film containing oxygen in excess of the stoichiometric composition is an oxide film of which the amount of released oxygen converted into oxygen atoms is greater than or equal to $1.0 \times 10^{18}$ atoms/cm$^3$, and preferably greater than or equal to $3.0 \times 10^{20}$ atoms/cm$^3$ in thermal desorption spectroscopy (TDS) analysis at a surface temperature of the film of higher than or equal to 100° C. and lower than or equal to 700° C., or higher than or equal to 100° C. and lower than or equal to 500° C. For example, as such a material, a material containing silicon oxide or silicon oxynitride is preferably used. Alternatively, a metal oxide can be used. In this specification, "silicon oxynitride" refers to a material that contains oxygen at a higher proportion than nitrogen, and "silicon nitride oxide" refers to a material that contains nitrogen at a higher proportion than oxygen.

The insulator may be formed by a sputtering method, a chemical vapor deposition (CVD) method (including a thermal CVD method, a metal organic CVD (MOCVD) method, a plasma enhanced CVD (PECVD) method, and the like), a molecular beam epitaxy (MBE) method, an atomic layer deposition (ALD) method, a pulsed laser deposition (PLD) method, or the like.

For the insulator having planarity, a heat-resistant organic material, such as polyimide, acrylic, benzocyclobutene-based resin, polyamide, or epoxy can be used. Other than such organic materials, it is also possible to use a siloxane-based resin, PSG (phosphosilicate glass), BPSG (borophosphosilicate glass), or the like. Note that the insulator may be formed by stacking a plurality of insulating films formed using these materials. Depending on the material, the insulator can be formed by a method such as a CVD method, a sputtering method, an SOG method, spin coating, dipping, spray coating, or a droplet discharge method (such as an ink-jet method), a printing method (such as screen printing or offset printing), or with a tool (equipment) such as a doctor knife, a roll coater, a curtain coater, or a knife coater.

As a method for forming the insulator having planarity, other than the above-described method, a chemical mechanical polishing (CMP) method can be used. After the formation of the insulator, the surface of the insulator is subjected to CMP treatment, so that a plane surface can be obtained.

For the semiconductor, a semiconductor such as a polycrystalline semiconductor, a microcrystalline semiconductor, an amorphous semiconductor, or a compound semiconductor can be used. For example, amorphous silicon, polycrystalline silicon or single crystal silicon, or such a semiconductor doped with an element belonging to Group 15 such as phosphorus of the periodic table may be used. Alternatively, an oxide semiconductor such as an In—Ga—Zn—O-based oxide semiconductor may be used.

A metal formed with aluminum, titanium, chromium, nickel, copper, yttrium, zirconium, molybdenum, silver, tantalum, niobium, or tungsten, or an alloy material or a compound material containing any of these as its main component can be used for the conductor. Alternatively, polycrystalline silicon to which an impurity such as phosphorus is added can be used. The conductor may have a single-layer structure or a stack of a plurality of materials. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. When the metal nitride film is provided, adhesiveness of the metal film can be increased; thus, separation can be prevented. Note that a transparent conductive material containing indium oxide, tin oxide, or zinc oxide may be used.

The conductor can be formed by a sputtering method, an evaporation method, a CVD method, or the like. The CVD method can be classified into a plasma enhanced CVD (PECVD) method using plasma, a thermal CVD (TCVD) method using heat, and the like. Depending on the used source gas, the CVD method can be classified into a metal CVD (MCVD) method and a metal organic CVD (MOCVD) method. By using the PECVD method, a high-quality film can be formed at a relatively low temperature. By using the TCVD method, in which plasma is not used, a film can be formed with few defects because damage caused by plasma does not occur.

Here, a method for processing a film is described. In the case of finely processing a film, a variety of fine processing techniques can be used. For example, a method may be used in which a resist mask formed by a photolithography process or the like is subjected to thinning treatment. Alternatively, a method may be used in which a dummy pattern is formed by a photolithography process or the like, the dummy pattern is provided with a sidewall and is then removed, and a film is etched using the remaining sidewall as a resist mask. In order to achieve a high aspect ratio, anisotropic dry etching is preferably used for etching of a film. Alternatively, a hard mask formed of an inorganic film or a metal film may be used.

As light used to form the resist mask, light with an i-line (with a wavelength of 356 nm), light with a g-line (with a wavelength of 436 nm), light with an h-line (with a wavelength of 405 nm), or light in which the i-line, the g-line, and the h-line are mixed can be used. Alternatively, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use extreme ultra-violet light, X-rays, or an electron beam because extremely minute processing can be performed. Note that in the case of performing exposure by scanning a beam such as an electron beam, a photomask is not needed.

An organic resin film having a function of improving adhesion between the film to be processed and a resist film may be formed before the resist film serving as a resist mask is formed. The organic resin film can be formed to have a plane surface by covering a step thereunder by a spin coating method or the like, and thus can reduce variation in thickness of the resist mask over the organic resin film. In the case of fine processing, in particular, a material serving as a film having a function of preventing reflection of light for the exposure is preferably used for the organic resin film. Examples of such an organic resin film include a bottom anti-reflection coating (BARC) film. The organic resin film may be removed at the same time as the removal of the resist mask or after the removal of the resist mask.

At least part of this embodiment can be implemented in combination with any of the embodiments described in this specification as appropriate.

Embodiment 7

An oxide semiconductor that can be favorably used for a semiconductor film of one embodiment of the present invention is described in this embodiment.

An oxide semiconductor has a wide energy gap of 3.0 eV or more. A transistor including an oxide semiconductor film obtained by processing of the oxide semiconductor in an appropriate condition and a sufficient reduction in carrier density of the oxide semiconductor can have much lower leakage current between a source and a drain in an off state (off-state current) than a conventional transistor including silicon.

An applicable oxide semiconductor preferably contains at least indium (In) or zinc (Zn). In particular, In and Zn are preferably contained. In addition, as a stabilizer for reducing variation in electric characteristics of the transistor using the oxide semiconductor, one or more selected from gallium (Ga), tin (Sn), hafnium (Hf), zirconium (Zr), titanium (Ti), scandium (Sc), yttrium (Y), and an lanthanoid (such as cerium (Ce), neodymium (Nd), or gadolinium (Gd), for example) is preferably contained.

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, an "In—Ga—Zn-based oxide" means an oxide containing In, Ga, and Zn as its main components and there is no particular limitation on the ratio of In, Ga, and Zn. The In—Ga—Zn-based oxide may contain another metal element in addition to In, Ga, and Zn.

Alternatively, a material represented by $In_{1+\alpha}M_{1-\alpha}O_3(ZnO)_m$ ($-1 \leq \alpha \leq 1$, m>0, and m is not an integer) may be used as an oxide semiconductor. Note that M represents one or more metal elements selected from Ga, Fe, Mn, and Co, or the above-described element as a stabilizer. Alternatively, as the oxide semiconductor, a material represented by $In_2SnO_5(ZnO)_n$, (n>0, and n is a natural number) may be used.

For example, In—Ga—Zn-based oxide with an atomic ratio of In:Ga:Zn=1:1:1, 1:3:2, 1:3:4, 1:3:6, 3:1:2, or 2:1:3, or an oxide whose composition is in the neighborhood of the above compositions may be used.

When an oxide semiconductor film contains a large amount of hydrogen, the hydrogen and an oxide semiconductor are bonded to each other, so that part of the hydrogen serves as a donor and causes generation of an electron which is a carrier. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. For this reason, it is preferred that oxygen be added to the oxide semiconductor to fill oxygen vacancies increased by the dehydration treatment (dehydrogenation treatment). In this specification and the like, supplying oxygen to an oxide semiconductor film may be expressed as oxygen adding treatment, and treatment for making the oxygen content of an oxide semiconductor film be in excess of that in the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density which is $1\times10^{17}/cm^3$ or lower, $1\times10^{16}/cm^3$ or lower, $1\times10^{15}/cm^3$ or lower, $1\times10^{14}/cm^3$ or lower, or $1\times10^{13}/cm^3$ or lower.

Thus, the transistor including an i-type or substantially i-type oxide semiconductor film can have extremely favorable off-state current characteristics. For example, the drain current at the time when the transistor including an oxide semiconductor film is in an off-state can be less than or equal to $1\times10^{-18}$ A, preferably less than or equal to $1\times10^{-21}$ A, further preferably less than or equal to $1\times10^{-24}$ A at room temperature (about 25° C.); or less than or equal to $1\times10^{-15}$ A, preferably less than or equal to $1\times10^{-18}$ A, further preferably less than or equal to $1\times10^{-21}$ A at 85° C. Note that an off state of an n-channel transistor refers to a state where the gate voltage is sufficiently lower than the threshold voltage. Specifically, the transistor is in an off state when the gate voltage is lower than the threshold voltage by 1V or more, preferably by 2V or more, or 3V or more.

<Structure of Oxide Semiconductor>

A structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS is described.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

The CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 13A:
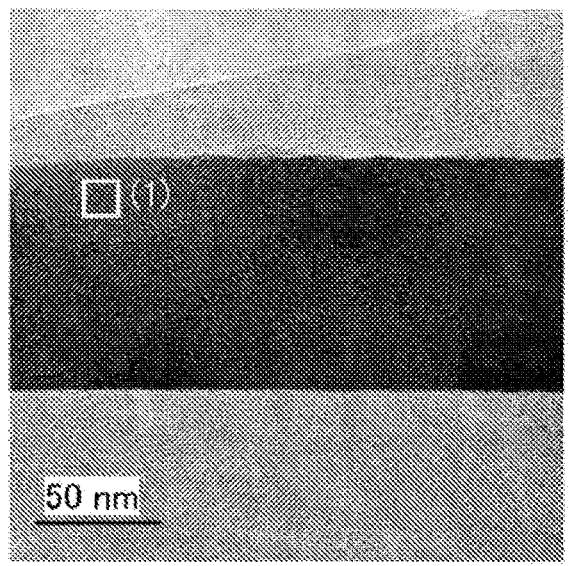
FIGS. 13A to 13D are Cs-corrected high-resolution TEM images of a cross section of a CAAC-OS and a cross-sectional schematic view of a CAAC-OS.

A CAAC-OS observed with TEM will be described below. FIG. 13A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 13B:
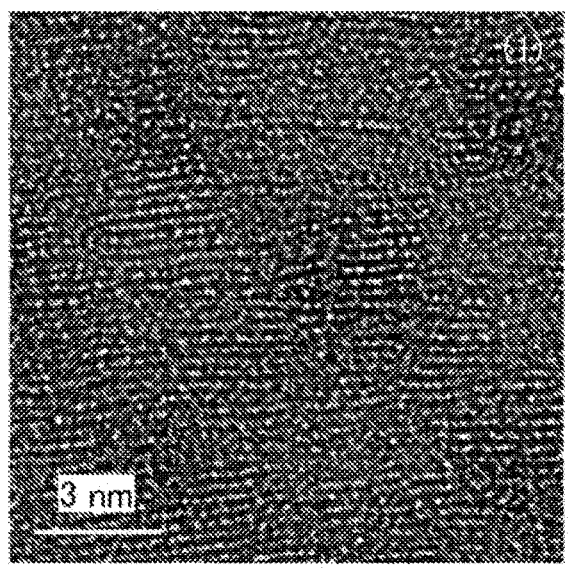

FIG. 13B is an enlarged Cs-corrected high-resolution TEM image of a region (1) in FIG. 13A. FIG. 13B shows that metal atoms are arranged in a layered manner in a pellet. Each metal atom layer has a configuration reflecting unevenness of a surface over which a CAAC-OS film is formed (hereinafter, the surface is referred to as a formation surface) or a top surface of the CAAC-OS film, and is arranged parallel to the formation surface or the top surface of the CAAC-OS film.

Figure 13C:
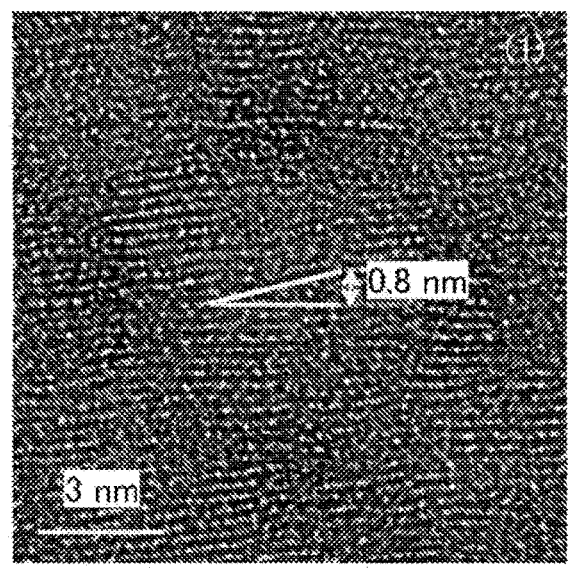

As shown in FIG. 13B, the CAAC-OS has a characteristic atomic arrangement. The characteristic atomic arrangement is denoted by an auxiliary line in FIG. 13C. FIGS. 13B and 13C prove that the size of a pellet is approximately greater than or equal to 1 nm and less than or equal to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 13D:
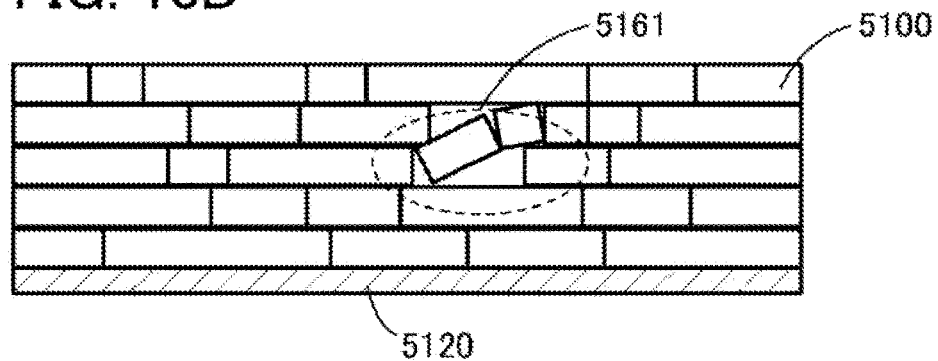

Here, according to the Cs-corrected high-resolution TEM images, the schematic arrangement of pellets 5100 of a CAAC-OS over a substrate 5120 is illustrated by such a structure in which bricks or blocks are stacked (see FIG. 13D). The part in which the pellets are tilted as observed in FIG. 13C corresponds to a region 5161 shown in FIG. 13D.

Figure 14A:
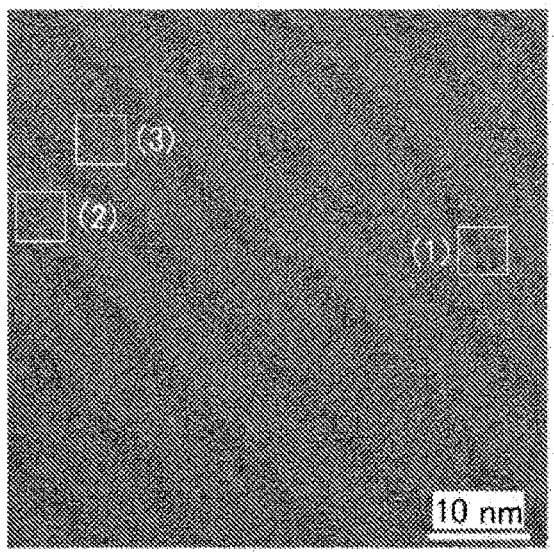
FIGS. 14A to 14D are Cs-corrected high-resolution TEM images of a plane of a CAAC-OS.
Figure 14B:
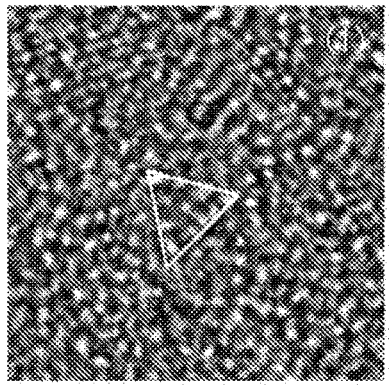
Figure 14C:
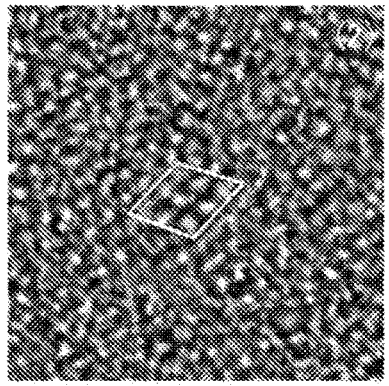
Figure 14D:
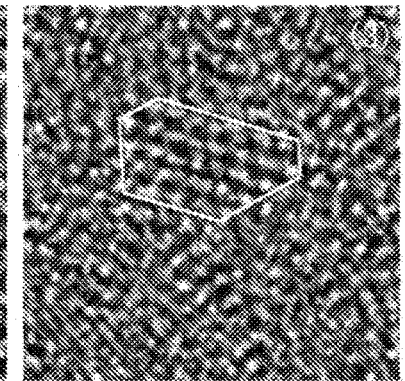

FIG. 14A shows a Cs-corrected high-resolution TEM image of a plane of the CAAC-OS observed from a direction substantially perpendicular to the sample surface. FIGS. 14B, 14C, and 14D are enlarged Cs-corrected high-resolution TEM images of regions (1), (2), and (3) in FIG. 14A, respectively. FIGS. 14B, 14C, and 14D indicate that metal atoms are arranged in a triangular, quadrangular, or hexagonal configuration in a pellet. However, there is no regularity of arrangement of metal atoms between different pellets.

Figure 15A:
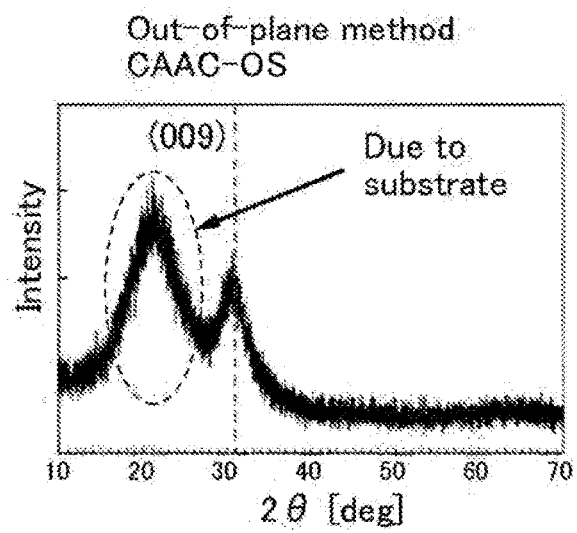
FIGS. 15A to 15C show structural analysis of a CAAC-OS and a single crystal oxide semiconductor by XRD.

Next, a CAAC-OS analyzed by X-ray diffraction (XRD) will be described. For example, when the structure of a CAAC-OS including an $InGaZnO_4$ crystal is analyzed by an out-of-plane method, a peak appears at a diffraction angle (2θ) of around 31° as shown in FIG. 15A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that, in the CAAC-OS analyzed by an out-of-plane method, a peak appear when 2θ is around 31° and that a peak not appear when 2θ is around 36°.

Figure 15B:
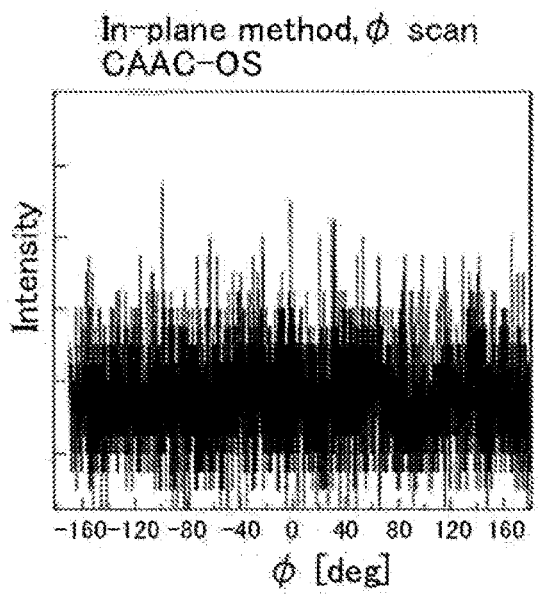
Figure 15C:
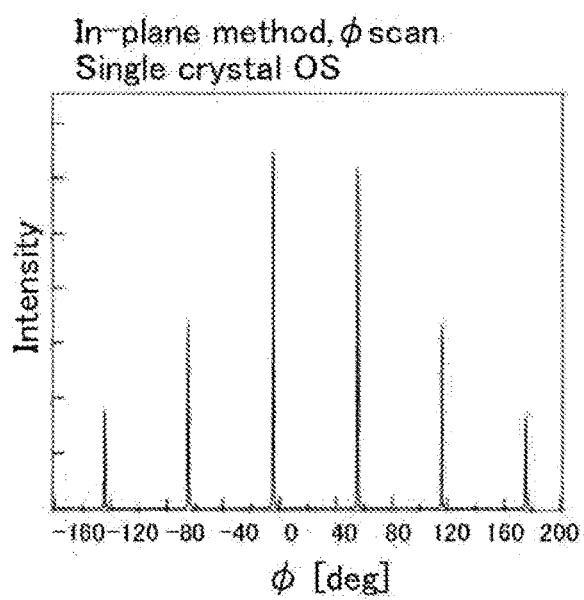

On the other hand, in structural analysis of the CAAC-OS by an in-plane method in which an X-ray beam is incident on a sample in a direction substantially perpendicular to the c-axis, a peak appears when 2θ is around 56°. This peak is attributed to the (110) plane of the $InGaZnO_4$ crystal. In the case of the CAAC-OS, when analysis (φ scan) is performed with 2θ fixed at around 56° and with the sample rotated using a normal vector of the sample surface as an axis (axis), as shown in FIG. 15B, a peak is not clearly observed. In contrast, in the case of a single crystal oxide semiconductor of $InGaZnO_4$, when φ scan is performed with 2θ fixed at around 56°, as shown in FIG. 15C, six peaks which are derived from crystal planes equivalent to the (110) plane are observed. Accordingly, the structural analysis using XRD shows that the directions of a-axes and b-axes are irregularly oriented in the CAAC-OS.

Figure 16A:
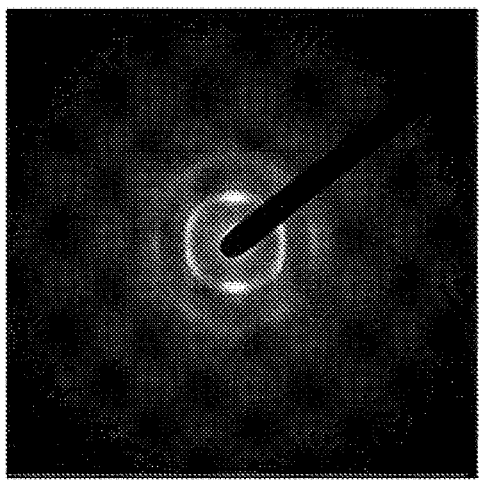
FIGS. 16A and 16B show electron diffraction patterns of a CAAC-OS.
Figure 16B:
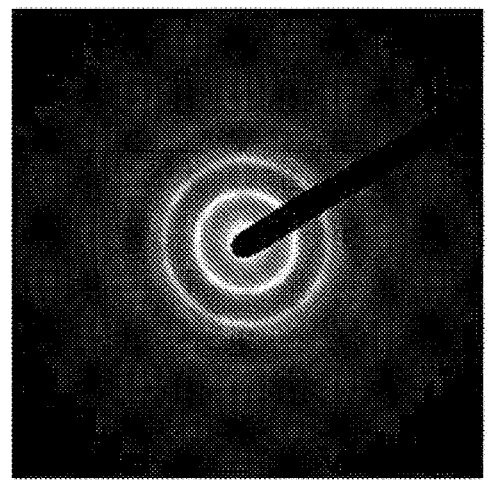

Next, a CAAC-OS analyzed by electron diffraction will be described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 16A can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 16B shows a diffraction pattern obtained in such a manner that an electron beam with a probe diameter of 300 nm is incident on the same sample in a direction perpendicular to the sample surface. As shown in FIG. 16B, a ring-like diffraction pattern is observed. Thus, the electron diffraction also indicates that the a-axes and b-axes of the pellets included in the CAAC-OS do not have regular alignment. The first ring in FIG. 16B is considered to be derived from the (010) plane, the (100) plane, and the like of the InGaZnO$_4$ crystal. The second ring in FIG. 16B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. For example, impurities contained in the oxide semiconductor might serve as carrier traps or carrier generation sources. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with a low carrier density (specifically, lower than $8\times10^{11}/cm^3$, preferably lower than $1\times10^{11}/cm^3$, further preferably lower than $1\times10^{10}/cm^3$, and is higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS will be described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, bright regions in a circular (ring) pattern are shown in some cases. Also in a nanobeam electron diffraction pattern of the nc-OS, a plurality of spots are shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 17:
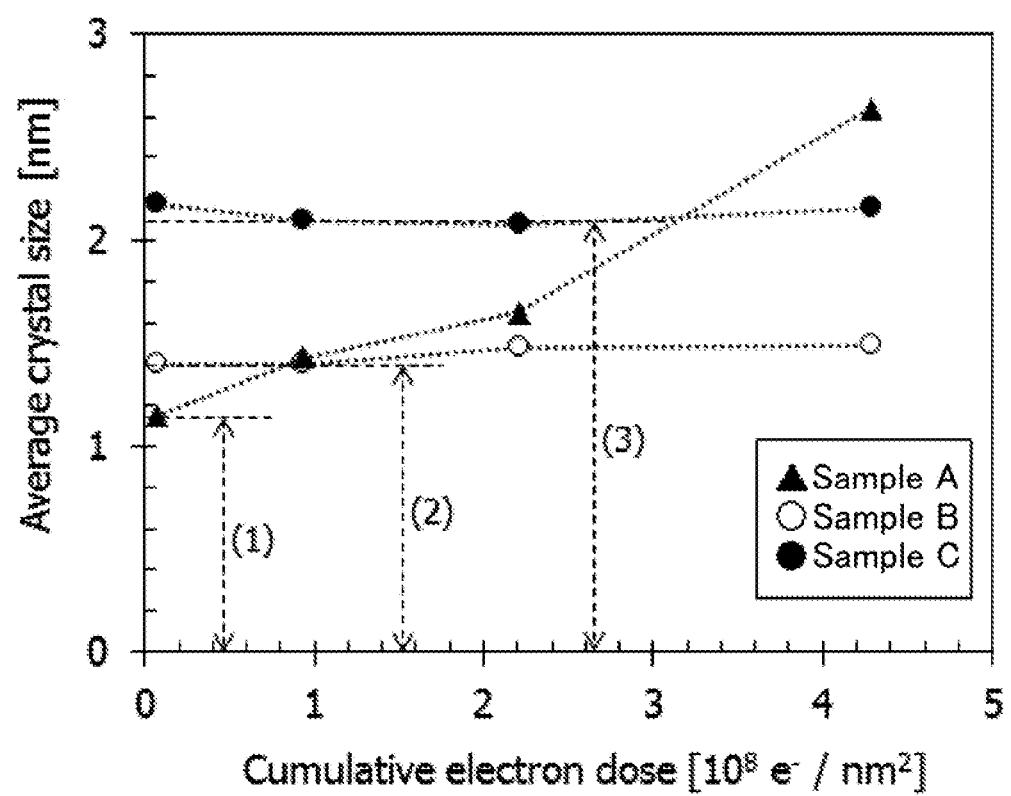
FIG. 17 shows a change of crystal parts of an In—Ga—Zn oxide owing to electron irradiation.

FIG. 17 shows change in the average size of crystal parts (at 22 points to 45 points) in each sample. Note that the crystal part size corresponds to the length of a lattice fringe. FIG. 17 indicates that the crystal part size in the a-like OS increases with an increase in the cumulative electron dose. Specifically, as shown by (1) in FIG. 17, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 17, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

At least part of this embodiment can be implemented in combination with any of the embodiments described in this specification as appropriate.

Embodiment 8

A semiconductor device of one embodiment of the present invention can be used for display devices, personal computers, and image reproducing devices provided with recording media (typically, devices that reproduce the content of recording media such as digital versatile discs (DVD) and have displays for displaying the reproduced images). Other than the above, as an electronic device which can be provided with the semiconductor device of an embodiment of the present invention, mobile phones, game consoles including portable game consoles, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, medical equipment, and the like can be given. FIGS. 18A to 18F illustrate specific examples of these electronic devices.

Figure 18A:
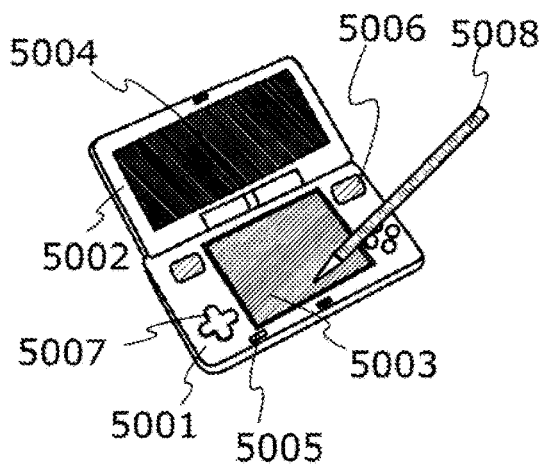
FIGS. 18A to 18F each illustrate an example of an electronic appliance.

FIG. 18A illustrates a portable game console, which includes a housing 5001, a housing 5002, a display portion 5003, a display portion 5004, a microphone 5005, speakers 5006, operation keys 5007, a stylus 5008, and the like. The semiconductor device of one embodiment of the present invention can be used for a variety of integrated circuits included in portable game consoles. Note that although the portable game console illustrated in FIG. 18A includes the two display portions 5003 and 5004, the number of display portions included in the portable game console is not limited to two.

Figure 18B:
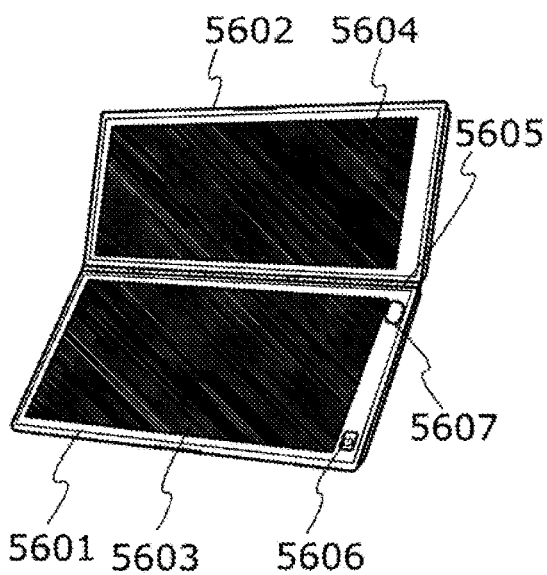

FIG. 18B illustrates a portable information terminal, which includes a first housing 5601, a second housing 5602, a first display portion 5603, a second display portion 5604, a joint 5605, an operation key 5606, a biometric authentication device 5607, and the like. The semiconductor device of one embodiment of the present invention can be used for a variety of integrated circuits included in portable information terminals. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. An image on the first display portion 5603 may be switched depending on the angle between the first housing 5601 and the second housing 5602 at the joint 5605.

Figure 18C:
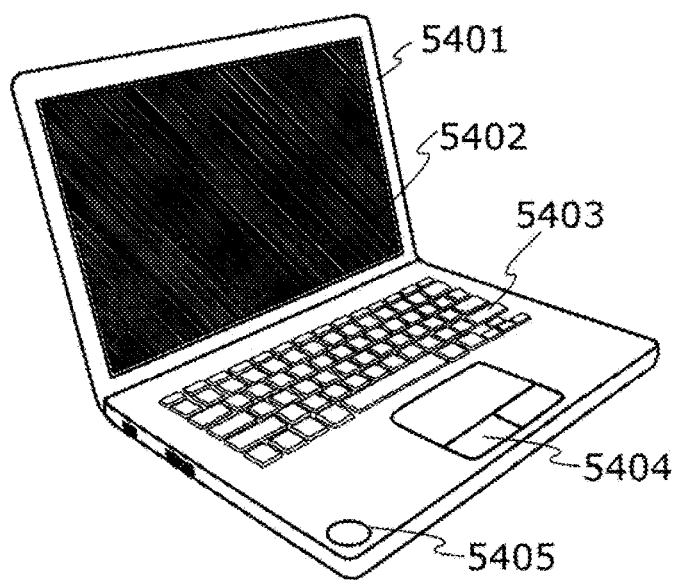

FIG. 18C illustrates a laptop personal computer, which includes a housing 5401, a display portion 5402, a keyboard 5403, a pointing device 5404, a biometric authentication device 5405, and the like. The semiconductor device of one embodiment of the present invention can be used for a variety of integrated circuits included in laptop personal computers.

Figure 18D:
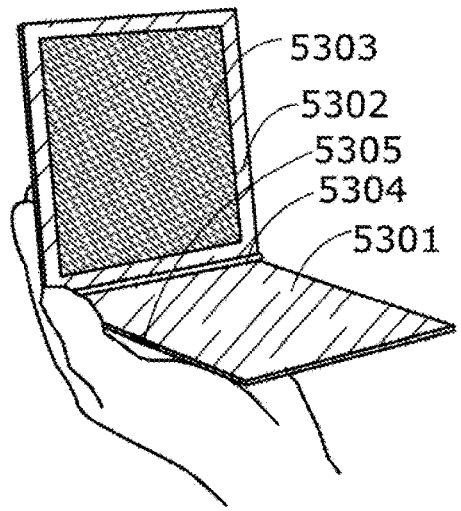

FIG. 18D illustrates a hand mirror, which includes a first housing 5301, a second housing 5302, a mirror 5303, a joint 5304, a switch 5305, and the like. The first housing 5301 and the second housing 5302 are connected with the joint 5304, and the angle between the first housing 5301 and the second housing 5302 can be changed with the joint 5304. Lighting devices are used for the first housing 5301 and the second housing 5302. The switch 5305 controls light, on/off, and the like of the lighting devices. The lighting device includes a planar light-emitting element. This light-emitting element may have a structure of switching between the light-emission state and the non-light-emission state in accordance with the angle between the first housing 5301 and the second housing 5302 at the joint 5304. The semiconductor device of one embodiment of the present invention can be used for a variety of integrated circuits for controlling operation of the lighting device.

Figure 18E:
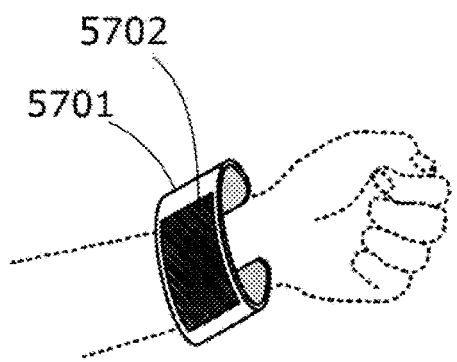

FIG. 18E illustrates a display device, which includes a housing 5701 having a curved surface, a display portion 5702, and the like. The semiconductor device of one embodiment of the present invention can be used for a variety of integrated circuits for controlling operation of the display device used as the display portion 5702.

Figure 18F:
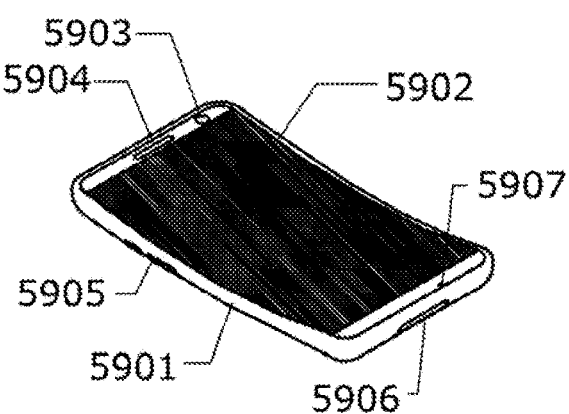

FIG. 18F illustrates a mobile phone, which includes a display portion 5902, a microphone 5907, a speaker 5904, a camera 5903, an external connection port 5906, and an operation button 5905 in a housing 5901 with a curved surface. The semiconductor device of one embodiment of the present invention can be used for a variety of integrated circuits for controlling operation of the display device used as the display portion 5902.

Embodiment 9

Figure 19:
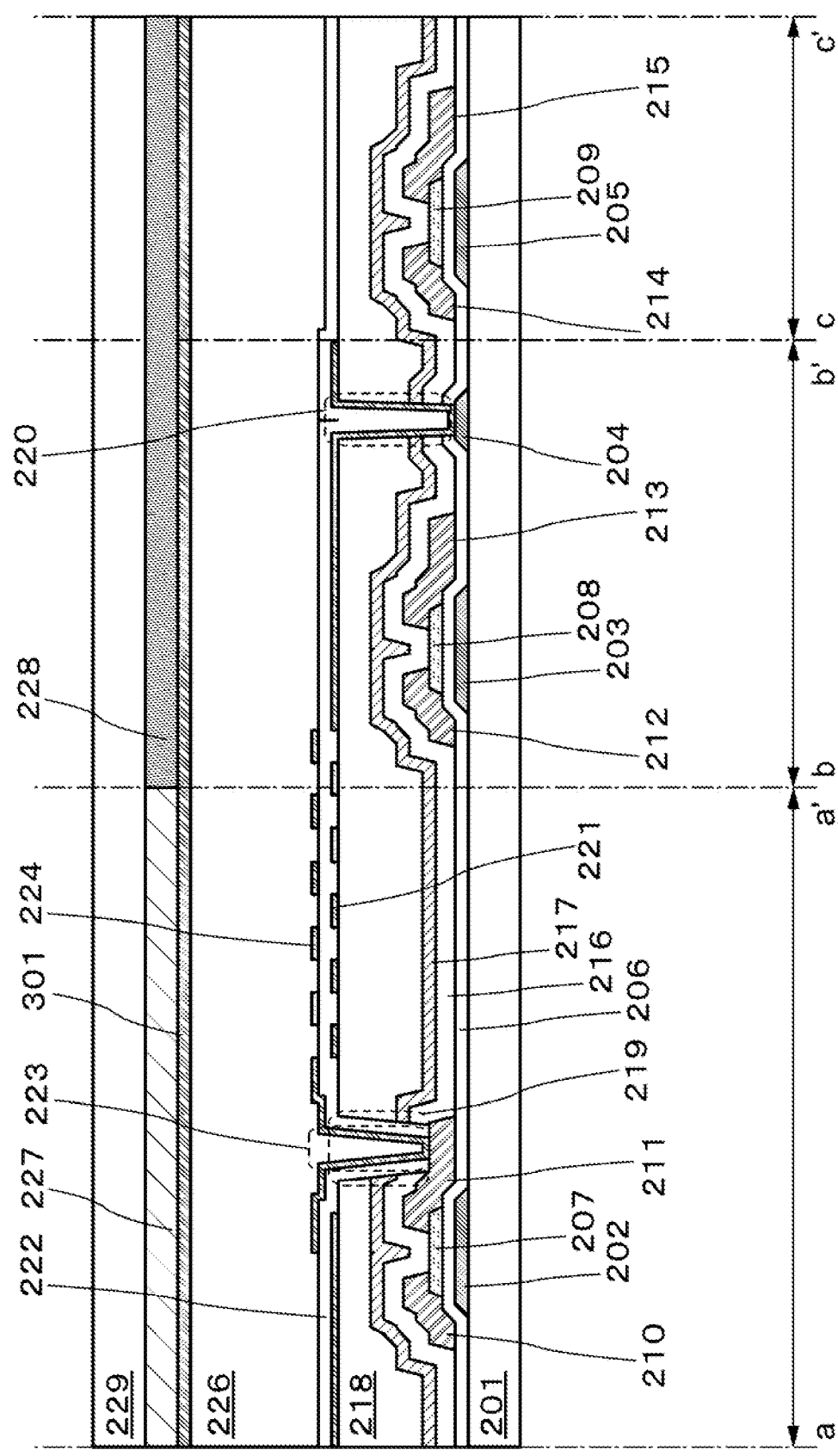
FIG. 19 illustrates a structure example of a display device.

FIG. 19 is a cross-sectional view of a liquid crystal display device integrated with an active matrix touch sensor of one embodiment of the present invention. In FIG. 19, a cross section a-a' illustrates part of a display element; b-b', a sensor unit; and c-c', part of circuit.

FIG. 19 illustrates an example in which the shape of the conductive film 221 in FIG. 3 is modified. In FIG. 3, the conductive film 221 is not provided with a slit; while the conductive film 221 is provided with a slit in FIG. 19. Since the structure of FIG. 19 is similar to that of FIG. 3 except for the shape of the conductive film 221, the description is omitted.

Figure 20:
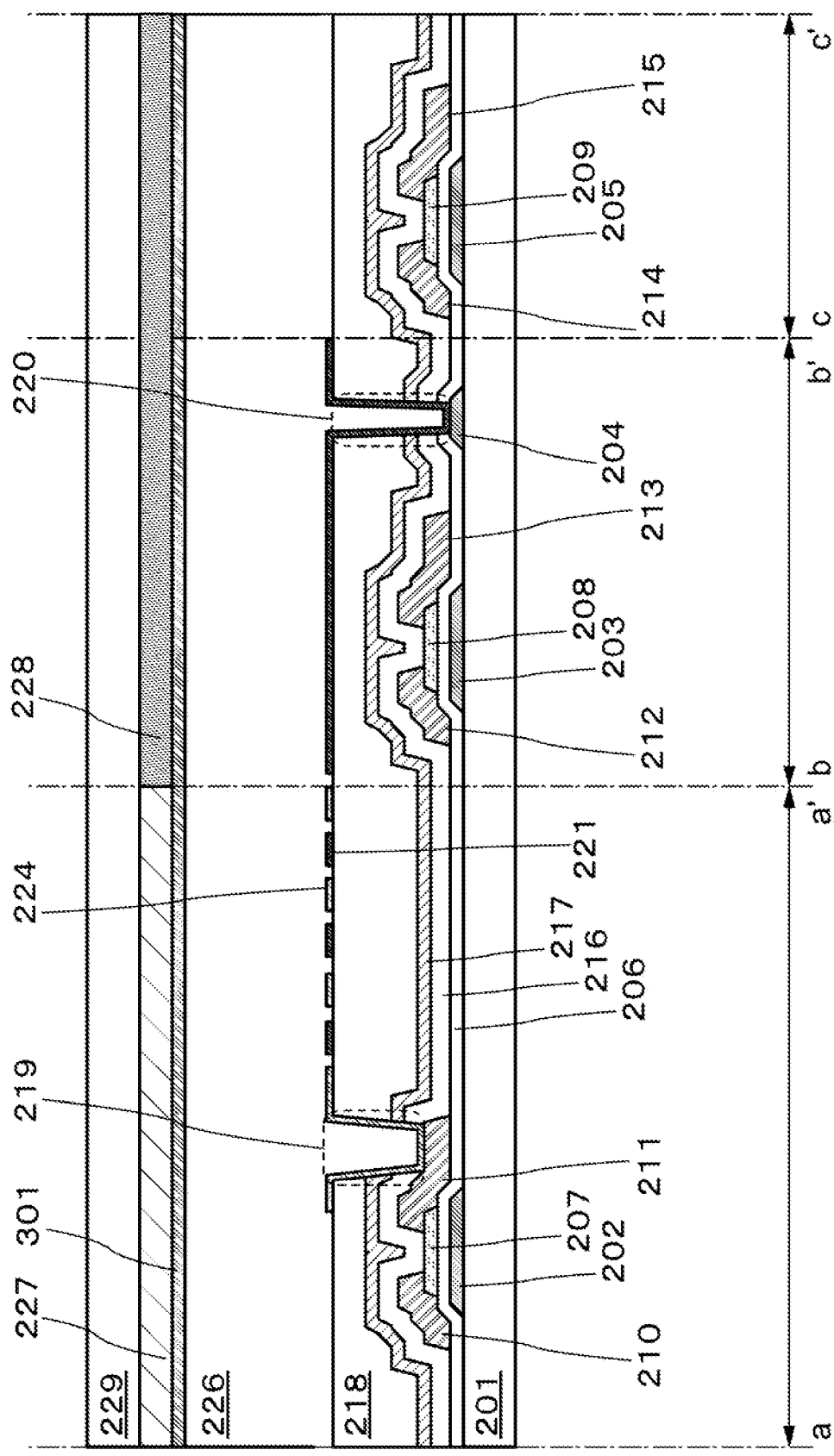
FIG. 20 illustrates a structure example of a display device.

FIG. 20 is a cross-sectional view of a liquid crystal display device integrated with an active matrix touch sensor of one embodiment of the present invention. In FIG. 20, a cross section a-a' illustrates part of a display element; b-b', a sensor unit; and c-c', part of circuit.

FIG. 20 illustrates an example in which the conductive films 224 and 221 in FIG. 3 are formed over the insulating film 218. FIG. 20 illustrates an example in which the conductive films 224 and 221 are formed over the same surface.

A structure of a transistor used for the liquid crystal display device integrated with the active matrix touch sensor of one embodiment of the present invention is not particularly limited and transistors with various structures can be used. Although the bottom-gate transistor is shown in this embodiment, this embodiment is not limited to this. For example, a top-gate transistor may be used.

At least part of this embodiment can be implemented in combination with any of the embodiments described in this specification as appropriate.

This application is based on Japanese Patent Application serial no. 2014-243995 filed with Japan Patent Office on Dec. 2, 2014, the entire contents of which are hereby incorporated by reference.

What is claimed is:

1. A display device having a display portion comprising:
a first substrate;
a first transistor over the first substrate;
a first conductive film over the first transistor, a first part of the first conductive film having a plurality of first slits;
a first pixel electrode comprising a first region overlapping with the first transistor and a second region having a plurality of second slits, the first pixel electrode being electrically connected to the first transistor;
a liquid crystal layer over the first conductive film and the first pixel electrode;
a second conductive film over the liquid crystal layer; and
a second substrate over the second conductive film,
wherein the display portion includes a sensor unit,
wherein the sensor unit includes a first electrode comprising a second part of the first conductive film and a second electrode comprising the second conductive film, and
wherein the plurality of second slits of the second region of the first pixel electrode overlap with the first part of the first conductive film.

2. The display device according to claim 1,
wherein the first transistor comprises an oxide semiconductor film.

3. The display device according to claim 1,
wherein each of the plurality of second slits of the second region of the first pixel electrode does not overlap with the plurality of first slits of the first part of the first conductive film.

4. The display device according to claim 1,
wherein the first part of the first conductive film is configured to be a common electrode.

5. The display device according to claim 1,
wherein the first conductive film comprises a transparent conductive material.

6. The display device according to claim 1,
wherein the second conductive film comprises a transparent conductive material.

7. The display device according to claim 1,
wherein the display portion further comprises a second pixel electrode being adjacent to the first pixel electrode and electrically connected to a second transistor, and
wherein the sensor unit overlaps with the first pixel electrode and the second pixel electrode.

8. The display device according to claim 1,
wherein the first part of the first conductive film does not overlap with the first transistor.

9. An electronic device comprising the display device according to claim 1.

10. A display device having a display portion comprising:
a first substrate;
a first transistor over the first substrate;
a first conductive film over the first transistor, a first part of the first conductive film having a plurality of first slits;
a first pixel electrode comprising a first region overlapping with the first transistor and a second region having a plurality of second slits, the first pixel electrode being electrically connected to the first transistor;
a liquid crystal layer over the first conductive film and the first pixel electrode;
a second conductive film over the liquid crystal layer; and
a second substrate over the second conductive film,
wherein the display portion includes a sensor unit,
wherein the sensor unit includes a first electrode comprising a second part of the first conductive film and a second electrode comprising the second conductive film,
wherein the plurality of second slits of the second region of the first pixel electrode overlap with the first part of the first conductive film, and
wherein the second part of the first conductive film does not overlap with the first pixel electrode.

11. The display device according to claim 10,
wherein the first transistor comprises an oxide semiconductor film.

12. The display device according to claim 10,
wherein each of the plurality of second slits of the second region of the first pixel electrode does not overlap with the plurality of first slits of the first part of the first conductive film.

13. The display device according to claim 10,
wherein the first part of the first conductive film is configured to be a common electrode.

14. The display device according to claim 10,
wherein the first conductive film comprises a transparent conductive material.

15. The display device according to claim 10,
wherein the second conductive film comprises a transparent conductive material.

16. The display device according to claim 10,
wherein the display portion further comprises a second pixel electrode being adjacent to the first pixel electrode and electrically connected to a second transistor, and
wherein the sensor unit overlaps with the first pixel electrode and the second pixel electrode.

17. An electronic device comprising the display device according to claim 10.

18. The display device according to claim 10,
wherein the first part of the first conductive film does not overlap with the first transistor.

* * * * *